United States Patent [19]

Stewart

[11] Patent Number: 5,122,792
[45] Date of Patent: Jun. 16, 1992

[54] ELECTRONIC TIME VERNIER CIRCUIT

[75] Inventor: Roger G. Stewart, Hillsborough Township, Somerset County, N.J.

[73] Assignee: David Sarnoff Research Center, Inc., Princeton, N.J.

[21] Appl. No.: 541,653

[22] Filed: Jun. 21, 1990

[51] Int. Cl.[5] .............................................. G09G 3/00
[52] U.S. Cl. ................... 340/793; 340/784; 358/236
[58] Field of Search ............ 340/793, 767, 784, 800, 340/805; 358/236, 241; 350/333, 332; 307/600, 602, 603; 328/129.1, 130.1, 152; 377/20

[56] References Cited

U.S. PATENT DOCUMENTS

| 2,888,557 | 9/1954 | Schneider | 307/602 |
|---|---|---|---|
| 3,319,088 | 5/1967 | Payne | 328/152 |
| 3,838,209 | 9/1974 | Tsuchiya et al. | 358/241 |
| 4,210,934 | 7/1980 | Kutaragi | 358/241 |
| 4,721,943 | 1/1988 | Stallkamp | 340/793 |
| 4,742,346 | 5/1988 | Gillette | 340/793 |
| 4,766,430 | 8/1988 | Gillette | 340/793 |
| 4,799,057 | 1/1989 | Takeda | 340/811 |
| 4,864,290 | 9/1989 | Waters | 340/805 |
| 4,967,110 | 10/1990 | Matsuura | 307/602 |

OTHER PUBLICATIONS

Emoto et al., 0.92-in. Active Matrix LCD with Fully Integrated Poly-Si TFT Driver of New Circuit Configuration, Japan Display '89, pp. 152-154.

Primary Examiner—Alvin E. Oberley
Assistant Examiner—Xiao Min Wu
Attorney, Agent, or Firm—W. J. Burke

[57] ABSTRACT

A drive circuit for a liquid crystal display converts a display information signal to an n bit gray scale code to control the brightness at a prescribed pixel. A counter receives the m most significant bits of the n bit gray scale code and a latch receives the n-m least significant bits of the n bit gray scale code. The counter is decremented by clock pulses occurring at predetermined intervals and a set of $2^{n-m}$ sub-interval timing signals are generated in response to each clock pulse. A transfer gate is enabled by an interval initiating pulse to permit charging of the pixel. One of the sub-interval timing signals is selected in response to the n-m least significant bits of the n bit gray scale code stored in the latch. The transfer gate is disabled by the sub-interval timing signal immediately succeeding the decrementing of the counter to its zero state.

37 Claims, 11 Drawing Sheets

ELECTRONIC TIME VERNIER CIRCUIT

This invention was made with Goverment support under Contract No. F33615-88-C-1825 awarded by the Department of the Air Force. The Goverment has certain rights in this invention.

FIELD OF THE INVENTON

The invention relates to display systems and more particularly to circuits for controlling pixel element brightness in display devices.

BACKGROUND OF THE INVENTION

A display device such as a liquid crystal display generally comprise a set of active picture elements or pixels arranged in an orthogonal matrix of rows and columns. Each pixel is individually illuminated by applying a voltage corresponding to the brightness to be displayed. The applied voltages are obtained from pixel driver circuits that convert received display information into drive voltages. Each driver circuit is individually associated with one column of the pixel matrix. The rows of the matrix are sequentially scanned and individual pixels of the row being scanned are illuminated to prescribed gray scale levels in response to the signals from the drive circuits.

The information to be displayed at a pixel is generally a digital coded signal or an analog video signal which is transformed into a digital code representing a discrete brightness level. A brightness level code is provided for each column of pixels in the display device. Color television and other high quality liquid crystal displays typically include 1440 columns. There may be 240 to 1152 rows depending on the display size and the rows are selected sequentially. Upon selection of a row, the 1440 data lines supply the pixels of the selected row with gray scale level signals. Consequently, 1440 data lines are required to provide the display columns with brightness level digital codes for each selected row and the data line drive circuits must operate at high rate to produce a satisfactory display.

U.S. Pat. No. 4,742,346 issued to Glynn Gillette et al., on May 3, 1988, discloses a system for applying gray scale coded brightness signals to the pixels of a display device in which data stored in shift register segments are transferred to counters through multiplex circuitry. Each counter controls a column transfer gate which applies an analog signal such as a ramp signal to charge the selected pixel while the transfer gate is enabled. The transfer gates are turned on at the selection of each display row. The counters are decremented at a fixed rate and each transfer gate is turned off when the stored count for the column is decremented to zero. While the counter arrangement simplifies transfer of brightness levels to the display pixels, the counting device must support a high counting rate. Liquid crystal displays, however, generally use thin film devices (e.g., field effect transistors) deposited on the display substrate. Thin film field effect transistors and therefore it is difficult to obtain a high count rate in a counter that uses such transistors. As higher quality displays are required, it is necessary to increase the count rate and the counter controlled transfer gate arrangement is more difficult to implement. It is desirable to provide a high rate timing control using limited speed devices such as thin film transistors.

SUMMARY OF THE INVENTION

Viewed from one aspect, the present invention is directed to a timing circuit to control a signal transfer device wherein the signal transfer device is enabled by a time interval initiating signal and is disabled at a time corresponding to an n bit information signal. A counter is set to the value of the m most significant bits of the n bit information signal and is decremented by first timing signals occurring at predetermined time intervals. The least significant n−m bits of the information signal select one of a sequence of second timing signals generated in response to the first timing signals. A control signal is produced when the counter reaches a predetermined value and the signal transfer device is disabled at a time corresponding to the occurrence of the selected second timing signal immediately succeeding the counter reaching the predetermined value.

In accordance with one aspect of the invention, the information signal is an n bit gray scale brightness signal for a display pixel and the signal transfer device is disabled at a time determined by the n bit gray scale brightness signal.

In an illustrative embodiment of the invention, the signal transfer device disabling means includes an m stage digital counter which is initially set to the value of the m most significant bits of the n bit gray scale brightness signal. A clock generates first timing signals at predetermined intervals. A sequence of vernier timing signals is produced in each predetermined interval. The first timing signals decrement the digital counter a predetermined time intervals and a first control signal is generated when the counter reaches its zero state. At least the n−m least significant bits of the n bit gray scale brightness signal are stored in a latch. One of the vernier timing signals is selected in response to the stored n−m bits of the n bit gray scale brightness signal and a second control signal is produced on the occurrence of the selected vernier timing signal. The signal transfer device is disabled in response to the first and second control signals at the time corresponding to the occurrence of the selected vernier timing signal immediately succeeding the decrementing of the digital counter to zero.

Viewed from another aspect, the invention is directed to a timing circuit comprising first and second terminals; means for receiving an information signal; a plurality of paths each having a distinct time delay therethrough for coupling the first terminal to the second terminal; and means responsive to the information signal for selecting one of the plurality of paths so as to couple the first and second terminals together.

Viewed from still another aspect the invention is directed to circuitry comprising a plurality of electrical paths between first and second terminals; control means coupled to each of the electrical paths for selectively enabling one of same so as to couple the first and second terminals. Each of the paths is adapted to be enabled so as to couple the first and second terminals together and each path has a different time delay associated therewith. The control means being responsive to an information signal, said information signal being used by the control means to determine which of the paths couple the first and second terminals.

The invention will be better understood from the following more detailed description taken with the accompanying drawings and claims.

DETAILED DESCRIPTION

Figure 1:
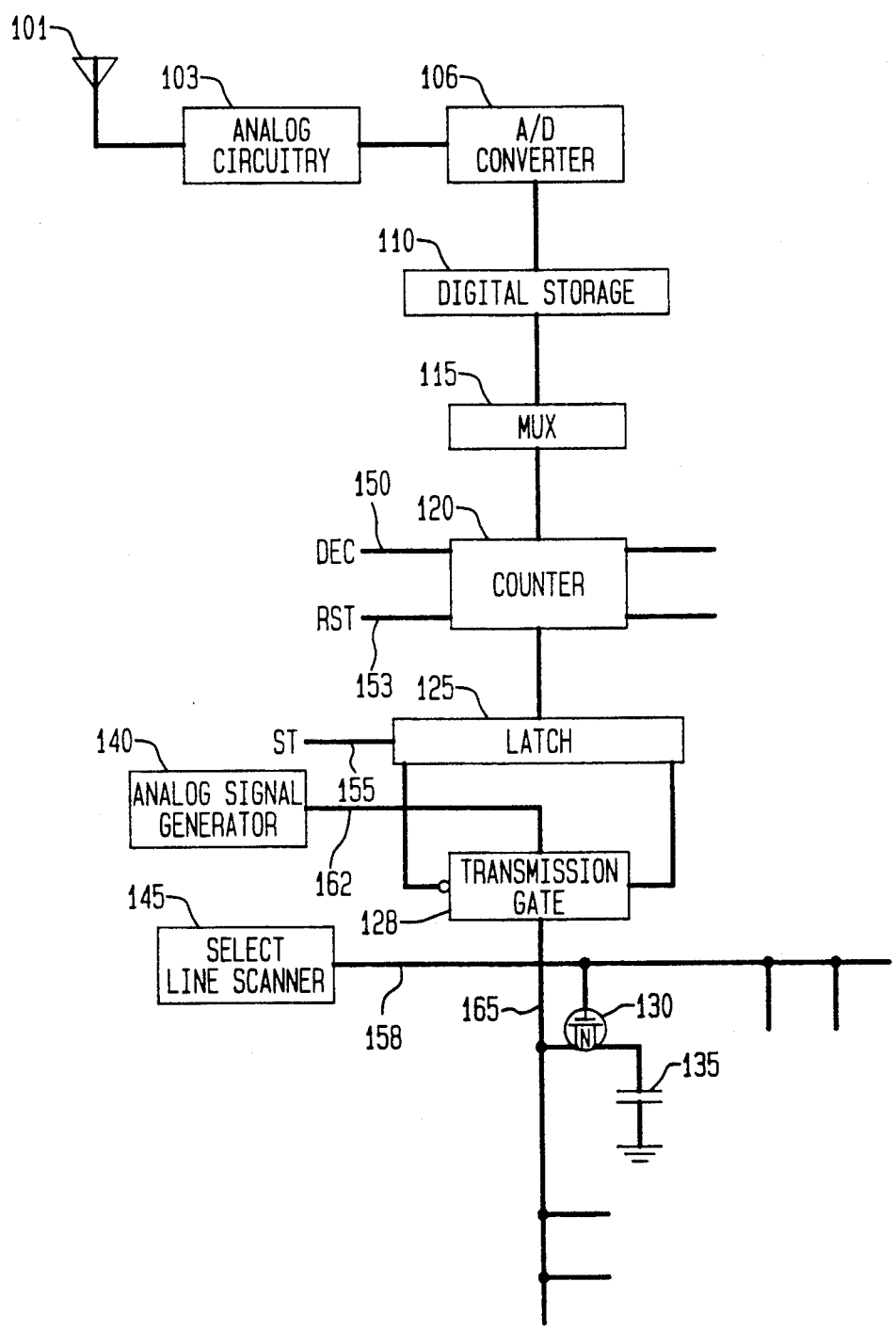
FIG. 1 is a block and schematic diagram of a portion of a prior art display driver circuit.

Referring now to FIG. 1, there is shown a block and schematic diagram of a prior art display pixel driver circuit 100. The display driver circuit 100 comprises an antenna 101, an analog circuitry 103, an analog to digital converter (A/D converter) 106, a digital storage 110, a multiplexer 115, a counter 120, a latch 125, a transmission gate 128, an n-channel MOS field effect transistor 130, a pixel capacitor 135, an analog signal generator 140 and a select line scanner 145. Antenna 101 is coupled to the input of analog circuitry 103. The output of analog circuitry 103 is coupled to an input of the analog to digital converter 106 and the output of the analog to digital converter 106 is coupled to an input of the digital storage 110. One output of digital storage 110 is connected to the input of the multiplexer 115 and an output of multiplexer 115 is coupled to the inputs of the individual stages of counter 120.

A zero count output of counter 120 is coupled to a reset input of latch 125 and outputs of latch 125 are coupled to the complementary clock inputs of transmission gate 128. An output of analog signal generator 140 is coupled to a signal input of transmission gate 128 and a signal output of transmission gate 128 is coupled to the drain electrode of transistor 130 as well as to the drain electrodes of other transistors (not shown) in the display column. The source electrode of transistor 130 is coupled to one terminal of pixel capacitor 135. A second terminal of the pixel capacitor 135 is coupled a ground potential plane of the display and the gate electrode of transistor 130 is coupled via a select line 158 to an output of select line scanner 145.

In operation, the antenna 101 of the circuit 100 receives an analog signal (e.g. a video signal) that includes the signal to be displayed at the location corresponding to pixel capacitor 135. The pixel driver circuit 100 including multiplexer 115, counter 120, latch 125 and transmission gate 128 is adapted to control the charging of pixel capacitor 135 by analog signal generator 140 to a voltage corresponding to the brightness to be displayed at the pixel. Analog signal generator 140 produces an analog signal such as a ramp signal which is coupled to pixel capacitor 135 through n-channel transistor 130. When the select line scanner 145 applies a high level (i.e. logical one, a "1") signal to line 158, transistor 130, as well as similar transistors (not shown) for the other pixels of a selected row of transistors are enabled (turned on or biased to conduction). The ramp signal from analog signal generator 140 is supplied to the drain electrode of transistor 130 through transmission gate 128. Pixel capacitor 135 is therefore charged through transistor 130 only when the transmission gate 128 is enabled in response to the operation of the driver circuit.

The signal received by antenna 101 is processed by analog circuitry 103 to produce an analog video signal. A/D converter 106 transforms the analog signal from analog circuitry 103 into a series of n bit digital codes. The n bit digital codes representing the gray scale values of the video signal from analog circuitry 103 are stored in digital storage 110. Counter 120 is an n bit counter (e.g., a six bit counter) that receives the n bits of one of the digital codes in digital store 110 through multiplexer 115. The Counter 120 is then set to the gray scale value of the digital code. The n bits stored in counter 120 control the brightness level at the pixel location corresponding to capacitor 135. A signal ST applied to an input of latch 125 initiates the ramp signal from analog signal generator 140 and sets the latch 125 at the beginning of each display line so that the transmission gate 128 is enabled (e.g. a short circuit or low impedance between the input and output thereof). The ramp voltage is thereby applied to the data line 165. If line 158 from select line scanner 145 is a "1", transistor 130 is enabled and couples the ramp voltage from transmission gate 128 to pixel capacitor 135.

The state of counter 120 is decremented at prescribed intervals (e.g. 1 microsecond) by decrement clock pulses DEC applied via a line 150 during the current display line. When counter 120 reaches its zero state, the zero count output from the counter 120 resets the latch 125. The latch 125 in turn causes transmission gate 128 to be disabled (i.e. a high impedance path) so that analog voltage generator 140 is disconnected from the drain electrode of transistor 130. Pixel capacitor 135 is thereby charged to a voltage corresponding to the n bit gray scale code initially placed in counter 120 at the beginning of the display line. If, for example, the ramp signal increases from zero volts to +5 volts during the row scan and the gray scale value digital code in counter 120 is a 111111 code, transmission gate 128 is enabled during the entire ramp signal and pixel capacitor 135 is charged to +5 volts. In the event that an 000001 code is stored in counter 120, transmission gate 128 is disabled at the beginning of the ramp signal and pixel capacitor 135 is not charged. An intermediate value of the gray scale code results in a voltage between zero and +5 volts across pixel capacitor 135 when latch 125 is reset by the zero count output signal of counter 120.

The counter arrangement shown in FIG. 1 provides an accurate method for setting the pixel capacitors of a liquid crystal display to proper gray scale values. It is necessary, however, to use a high speed counter 120 to obtain acceptable results. A further increase in the number of gray scale values to enhance the display increases the number of counter stages and requires even faster counter operation. The higher speed requirement is particularly difficult to achieve in display driver circuits using thin film transistors deposited on a display substrate. In accordance with the present invention, an n (e.g. 6) bit gray scale digital code is partitioned into an m <n bit most significant part and an at least an n−m bit least significant part. For example, the most significant part m may be 4 and the least significant part may be n−m+1 or 3. The m most significant bits are applied to a display counter which is decremented to zero at a prescribed rate. Since the number of stages in the display driver counter is reduced (e.g. from 6 to 4) the counting speed is significantly lower and the counting intervals are longer.

To obtain the accuracy of an n bit counter with the m <n bit counter of the present invention, a vernier type selection circuit generates a sequence of equally spaced timing pulses for each count interval of the m bit display counter. After the m bit counter reaches its zero state, the timing increments or pulses defined by the least significant part of the gray scale digital code determines the precise instant at which analog signal charging of the display pixel capacitor is terminated. The accuracy of the display control is thereby maintained at lower counting rates. For n equal to 6, the counter 120 of FIG. 1 requires a counting rate of 1 mHz. As will become clear from the below description of the present invention, the counter of the present invention may be an m=4 stage counter and the count rate is reduced to 250 kHz. The vernier circuit timing signals are spaced 1 microsecond apart so that the resulting timing is equivalent to a 1 mHz count rate. The vernier timing signal determined by the least significant portion of the gray scale code immediately following the zero count of the counter terminates the coupling of the ramp signal to the pixel capacitor. Consequently, 1 microsecond precision is obtained with a 250 kHz count rate.

The lower count rate obtained by employing the vernier selection circuit of the present invention permits better utilization of a display counter comprising deposited thin film transistors. A vernier selection circuit that employs thin film transistor switching devices, however, also exhibits relatively long switching times, e.g. 3 microseconds, that exceed the 1 microsecond spacing between vernier timing signals in the aforementioned example. The long switching times of the thin film transistors in the vernier selection circuit cause the timing pulses generated therein to overlap. As a result, the operation of the vernier selection circuit can be impaired. The problem is solved in accordance with the present invention by increasing the number of bits in the least significant portion of the gray scale digital code to control the selection of the vernier timing pulse and thereby inhibit vernier timing selection for unwanted overlapping vernier timing signals.

Figure 2:
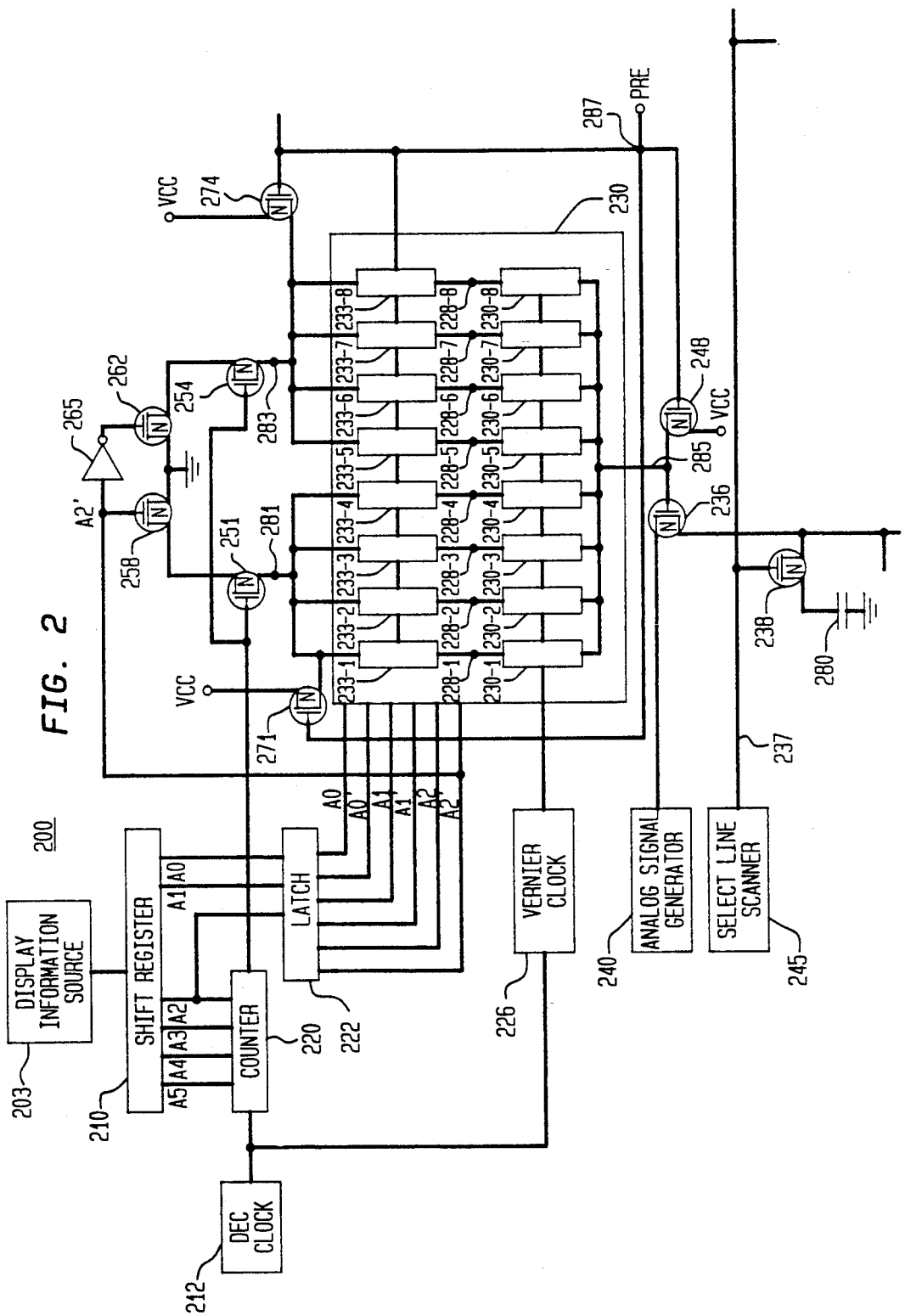
FIG. 2 is a general block and schematic diagram of a display driver circuit in accordance with the present invention.

Referring not to FIG. 2, there is shown a general block and schematic diagram of a display driver circuit 200 in accordance with the present invention. The circuit 200 of FIG. 2 comprises a display information source 203, a shift register 210, a decrement clock 212 (DEC clock), a counter 220, a latch 222, a vernier clock 226, an analog signal generator 240, a select line scanner 245, a vernier timing selection circuit 230, n-channel field effect transistors (FETs) 236, 238, 248, 251, 254, 258, 262, 271 and 274, and inverter 265 and a pixel, capacitor 280. In a typical embodiment, the transistors are all metal oxide semiconductor (MOS) field effect transistors. Vernier timing selection circuit 230 comprises vernier time selectors 230-1, 230-2, 230-3, 230-4, 230-5, 230-6, 230-7 and 230-8 and path selectors 233-1, 233-2, 233-3, 233-4, 233-5, 233-6, 233-7 and 233-8.

An output of the display information source 203 is coupled to the input of shift register 210. Outputs A2, A3, A4, and A5 of shift register 210 are coupled to the individual stage inputs of the four state counter 220 and outputs A0, A1, and A2 of the shift register 210 are coupled to separate inputs of latch 222. An output of decrement clock 212 is coupled to a decrement input of counter 220 and to an input of vernier clock 26. A zero count output of counter 220 is coupled to the gate electrodes of transistors 251 and 254. The A0, A1 and A2 outputs and the A0', A1' and A2' outputs of latch 222 are coupled to gating inputs (not shown) of path selectors 233-1 through 233-8 in vernier timing selection circuit 230. An output of vernier clock 226 is coupled to gating inputs (not shown) of vernier timers 230-1 through 230-8 of vernier timing selection circuit 230.

An output of analog signal generator 240 is coupled to the drain electrode of transistor 236. The source electrode of transistor 236 is coupled to the drain electrode of transistor 238. The gate electrode of transistor 236 is coupled to the source electrode of transistor 248, and to the column control line 285. In vernier timing selection circuit 230, the vernier timers 230-1 through 230-8 are coupled from column control line 285 to path selectors 233-1 through 233-8, respectively, through leads 228-1 through 228-8, respectively. Path selectors 233-1 through 233-4 are coupled between leads 228-1 through 228-4 and the drain electrode (terminal 281) of transistor 251. The path selectors 233-5 through 233-8 are coupled between leads 228-5 through 228-8 and the drain electrode (terminal 283) of transistor 254.

The gate electrode of transistor 238 is coupled to the output of select line scanner 245 through a conductor 237, and the source electrode of transistor 238 is connected to one terminal of the pixel capacitor 280. The gate electrode of transistor 258 is coupled to the A2' output of latch 222 and to the input of inverter 265. The drain electrode of transistor 258 is coupled to the source electrode of transistor 251 and the source electrodes of transistors 258 and 262 is coupled to an output of inverter 265, and the drain electrode of transistor 262 is coupled to the source electrode of transistor 254. The drain electrodes of transistors 248, 271 and 274 are all coupled to a positive voltage source +VCC, and the gate electrodes of transistors 248, 271 and 274 are coupled to a pulse input terminal 287 and to a precharge signal PRE applied thereto. The source electrode of transistor 271 is coupled to the drain electrode of transistor 251 and to terminal 281. The source electrode of transistor 274 is coupled to the drain electrode of transistor 254 and to terminal 283.

In operation, display information source 203 supplies digital display codes for a liquid crystal display comprising an array of pixel capacitors including the pixel represented by capacitor 280. The rows of pixels of which only one, the one containing transistor 238 and capacitor 280 is shown in detail, are sequentially selected by select line scanner 245. When the row including pixel capacitor 280 is selected, a "1" signal coupled from select line scanner 245 to the gate electrode of transistor 238 enables transistor 238 and similar transistors for other pixels (not shown) in the same row. The analog signal from analog signal generator 240, e.g. a ramp signal, is coupled to the drain electrode of transistor 236. Transistor 236 is enabled by a "1" on column control line 285 applied to its gate electrode. The voltage to which capacitor 280 is charged and consequently the pixel brightness is determined by the interval of the line scan during which column control line 285 is held at the "1" level.

Figure 3:
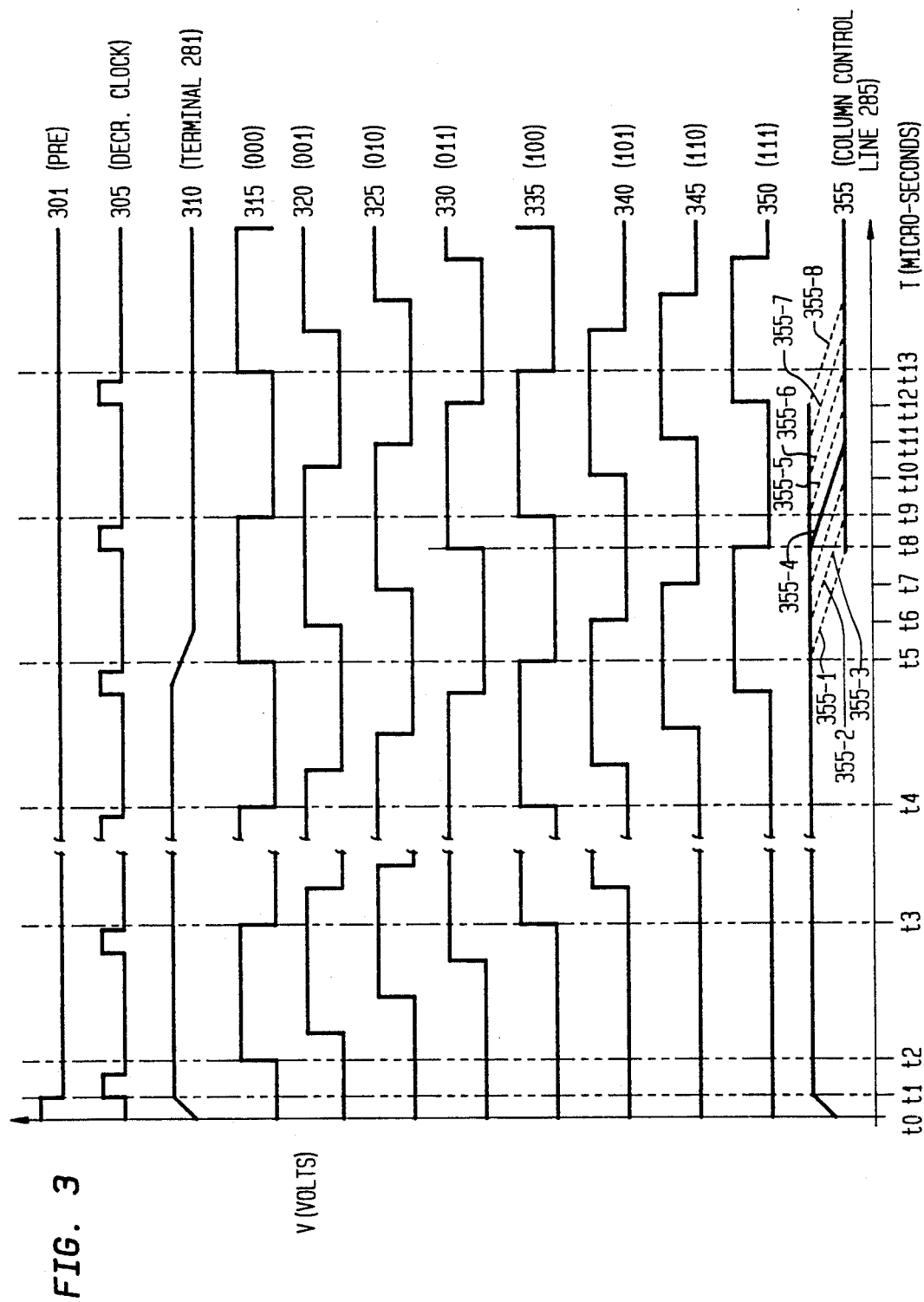
FIG. 3 is a timing diagram illustrating the operation of the display driver circuit of FIG. 2.

FIG. 3 shows waveforms illustrating the operation of the circuit 200 of FIG. 2 during a selected row scan with voltage V (volts) on the y axis and time (microseconds) on the x axis. To make the operation clearer, each of the waveforms has essentially the same amplitude and the same "1" and "0" levels except for waveform PRE. Waveform 301 of FIG. 3 shows the precharge pulse PRE applied to terminal 287 and therefrom to the gates of transistors 248, 271 and 274. Waveform 305 shows output decrement pulses from decrement clock 212. Waveform 310 shows the voltage at terminal 281 in FIG. 2. Waveforms 315 through 350 show the 000 through 111 outputs of vernier clock 226 and waveform 355 shows the voltage at column control line 285. Referring to FIGS. 2 and 3, the "1" of precharge pulse PRE of waveform 301 occurs between times t0 and t1 prior to the beginning of the ramp signal for the current row. The "1" precharge pulse PRE is applied to the path selectors 233-1 through 233-8 of vernier timing selection circuit 230 and to the gate electrodes of transistors 248, 271 and 274. The amplitude of the PRE is selected to exceed +VCC by at least the threshold voltage of transistors 248, 271 and 274 so that the +VCC is transferred to the gate electrode of transistor 236 through transistor 248 and the full level of +VCC is transferred to the drain electrodes of transistors 251 and 254 through transistors 271 and 274, respectively. Thus, transistor 236 is enabled by the +VCC voltage on column control line 285 and the pixel capacitor 280 receives the ramp signal from analog signal generator 240 through transistors 236 and 238. Pulse PRE operates as a time interval initiating signal that enables the ramp signal transfer transistor 236. Transistor is disabled when column control line 285 is discharged to a low voltage level, i.e. a logical zero (a "0"), through a discharge path including vernier timing selection circuit 230 and either the discharge path through transistors 251 and 258 or the discharge path through transistors 254 and 262. The time between the start of the ramp signal from analog signal generator 240 and the discharge of column control line 285 is determined by the value of the n bit gray scale brightness signal from display information source 203 to be displayed at the location corresponding to pixel capacitor 280.

Shift register 210 stores the digital codes at the output of display information source 203 and applies the code representing the gray scale value for pixel capacitor 280 to counter 220 and latch 222. In FIG. 2, the gray scale digital code is a 6 bit code having elements A0, A1, A2, A3, A4, and A5. Counter 220 is initially set to the count corresponding to the most significant bits A5, A4, A3 and A2. Latch 222 receives the least significant bits A2, A1 and A0. In contrast to the prior art driver circuit 100 shown in FIG. 1, counter 220 is a four bit counter and operates at a much lower rate than the six bit counter required in counter 120 of FIG. 1. If, for example, counter 120 of FIG. 1 operates at a one megahertz rate, the counting rate of the four bit counter 220 of FIG. 2 for one megahertz timing control operations in FIG. 2 need only be 250 kHz.

Counter 220 is decremented by pulses from decrement clock 212 shown in waveform 305 of FIG. 3. For the 250 kHz count rate of the present example, interval between the decrement clock pulses (waveform 305) is 4 microseconds. In FIG. 3, the first decrement clock pulse occurs at t1 just after the precharge pulse PRE of waveform 301. Subsequent decrement clock pulses repeat at a 250 kHz rate. When counter 220 reaches its zero state, the "1" at the zero count output from the counter is coupled to the gate electrodes of transistors 251 and 254. If the A2 bit from latch 222 is a "0", the drain electrode of transistor 251 is discharges to ground through enabled transistors 251 and 258. In the event the A2 bit is a "1", the drain electrode of transistor 254 is discharged to ground through transistors 254 and 262. Waveform 310 shows the voltage at terminal 281 in FIG. 2 when the A2 bit from latch 222 is a "0". As shown, terminal 281 is charged to the voltage +VCC by the precharge pulse PRE between times t0 and t1 and is discharged responsive to the zero count output of counter 220 at time t5.

In a typical embodiment, the drive circuit 200 shown in FIG. 2, except for decrement clock 212 and vernier clock 226, comprises thin film devices deposited on the display plate. As aforementioned, such thin film devices have relatively low cut-off frequencies and exhibit slower operation than equivalent bulk type devices. The reduced number of bits in counter 220 permits better utilization of thin film devices. Vernier timing selection circuit 230 employs thin film transistors as switching devices in vernier time selectors 230-1 through 230-8 and path selectors 233-1 through 233-8. These deposited thin film transistors also exhibit slow transition times compared to the vernier timing signals. For the one megahertz rate in FIG. 2, the switching devices of vernier timing selection circuit 230 may require three to four microseconds to complete the transitions from off states to on states but the devices are switched in sequence at one microsecond intervals. The pulses applied from vernier clock 226 to each vernier time selector 230-1 through 230-8 must therefore be four microseconds in duration to assure complete switching and are overlapped to provide the one microsecond sequencing.

As a consequence of the slow transition times of vernier time selectors 230-1 through 230-8 and path selectors 233-1 through 233-8 in vernier timing selection circuit 230, it is possible for more than one path through vernier timing selection circuit 230 to discharge column control line 285. In accordance with the present invention, selection of a unique path for discharge of column control line 285 is assured by dividing the path selectors into two groups. One group comprises path selectors 233-1 through 233-4 and is coupled to ground through transistor 258. The other group comprises path selectors 233-5 through 233-8 and is coupled to ground through transistor 262. If the A2 bit stored in latch 222 is a "0", only the first through the fourth vernier time selectors are possible. The disabling of transistor 262 by the A2 output of latch 222 removes the ground connection for path selectors 233-5 through 233-8. Unwanted completion of the paths through path selectors 233-5 through 233-8 is thereby prevented. In the event the stored A2 bit is a "1", only the fifth through the eight vernier time selectors are possible. The disabling of transistor 258 by the A2 bit of latch 222 insures that the paths through path selectors 233-1 through 233-4 to ground cannot be completed. In this manner, unwanted switching paths caused by the slow transition times of thin film transistors are removed. This, in turn, eliminates the possibility of a partial discharge of node 285.

Waveforms 315 through 350 of FIG. 3 illustrate the 000 through 111 outputs of vernier clock 226 in FIG. 2. In a preferred embodiment, the "1" portions of the vernier clock waveforms are 4 microseconds in duration to allow sufficient time for the vernier time selectors to switch from off states to on states. A full cycle of vernier clock 226 is shown between times t5 and t13. The first vernier timing signal is generated when the 000 output of vernier clock 226 (waveform 315) switches to a "1". The second through fourth vernier timing signals are generated responsive to the switching of the 001 through 011 outputs to their "1" states at times t6, t7 and t8, respectively as shown waveforms 320, 325 and 330. These vernier timing signals are spaced at one microsecond intervals and are started by the decrement clock pulse occurring just before time t5. The fifth through eighth vernier timing signals occur responsive to the switching of the 100 through 111 outputs of vernier clock 226 at times t9, t10, t11 and t12, respectively, in the immediately succeeding count interval between times t9 and t13 in waveforms 335, 340, 345, and 350. The transition times of vernier time selectors 230-1 through 230-8 are indicated as waveform portions 355-1 through 355-8, respectively, of waveform 355 in FIG. 3. As is readily seen, the slow transitions of the vernier time selectors overlap each other and overlap count intervals.

Assume for purposes of illustration that the A0 and A1 bits in the pixel driver circuit of FIG. 2 are "1"s while the A2 bit is a "0". After counter 220 is loaded with bits A5, A4, A3 and A2 by shift register 210, it is decremented by decrement clock pulses from decrement clock 212 (waveform 305). Counter 220 is decremented at regular intervals from the initial state determined by the A2, A3, A4 and A5 bits of the gray scale brightness signal from shift register 210 starting at time t1 in FIG. 3 to a zero state. Transistor 258 is enabled by the "1" A2' bit at its gate electrode while transistor 262 is disabled by the "0" applied to its gate electrode from inverter 265. When counter 220 reaches its zero state, e.g. just prior to time t5 in FIG. 3, a "1" is coupled from the output of counter 220 to the gate electrodes of transistors 251 and 254 and terminal 281 is discharged to a "0" through transistors 251 and 258. Terminal 281 remains discharged until another precharge pulse PRE is applied to the gate electrode of transistor 271 in the next scan line of select line scanner 245.

Just after the precharge pulse PRE is applied, the A0, A0', A1, A1', A2 and A2' bits from latch 222 are coupled to path selectors 233-1 through 233-8. As a result, the path selector addressed by the A0, A0', A1, A1', A2 and A2' bits is enabled and completes a path from one of leads 228-1 through 228-4 to terminal 281 at the drain electrode of transistor 251. If the A0 and A1 bits in latch 222 are "1"s while the A2 bit in latch 222 is a "0", path selector 233-4 is enabled to provide a path from line 228-4 to the drain electrode of transistor 251 just after the precharge pulse of waveform 301.

Vernier timing selection circuit 230 provides four successive vernier times in each interval between decrement clock pulses. The path from column control line 285 to line 228-1 through vernier time selector 230-1 is enabled by the first prescribed vernier time pulse 000 (waveform 315). The path from column control line 285 to line 228-2 through vernier time selector 230-2 is enabled by the second prescribed vernier time pulse 001 (waveform 320). The path from column control line 285 to line 228-3 through vernier time selector 230-3 is then enabled by the third vernier time pulse 010 (waveform 325). The path from column control line 285 to line 228-4 through vernier time selector 230-4 is then enabled by the fourth vernier time pulse 011 (waveform 330). In the next successive count interval, the path from column control line 285 to line 228-5 through is enabled by the fifth prescribed vernier time pulse 100 (waveform 335). The path from column control line 285 to line 228-6 through vernier time selector 230-6 is then enabled by the sixth prescribed vernier time pulse 101 (waveform 340). The path from column control line 285 to line 228-7 through vernier time selector 230-7 is then enabled by the seventh prescribed vernier time pulse 010 (waveform 345) and the path from column control line 285 to line 228-8 through vernier time selector 230-8 is enabled by the eighth prescribed vernier time pulse (waveform 350).

The path selector in vernier timing selection circuit 230 chosen by gray scale bits A2, A1 and A0 is enabled only by the prescribed vernier time pulse corresponding to gray scale bits A2, A1 and A0. Transistor 251, however, remains disabled until the zero count output of counter 220. Column control line 285 is therefore discharged only at the instant determined by the state of latch 222 in the interval immediately succeeding the zero count output signal from counter 220. The vernier time signals are generated by the positive transitions of the 000 to 111 outputs of vernier clock 226 shown in waveforms 315 through 350. The initial sequence of vernier clock pulses starts at time t2. A subsequent sequence is shown in the two successive count intervals between times t5 and t13.

The vernier time sequence is initiated by every alternate decrement clock pulse so that four vernier timing pulses are generated in each interval. Since bit A2 from latch 222 is a "0" for the 011 latch output, the path from column control line 285 to the ground potential point between transistors 258 and 262 is only completed through transistors 251 and 258. The completion of the path from column control line 285 to ground occurs at the vernier timing signals corresponding to the A0=1, A1=1 and A2=0 bits from latch 222 after the occurrence of the zero count output pulse from counter 220. In accordance with the present invention, counter 220 provides a coarse interval timing while the vernier timing selection circuit 230 provides vernier type timing within the interval determined by bit A2 from latch 222.

When counter 220 is set to the state determined by bits A2, A2, A4 and A5, latch 222 is set to the state determined by least significant bits A0, A1 and A2. The A0, A1 and A2 and the complement outputs A0', A1' and A2' of latch 222 are coupled to path selector switches 233-1 through 233-8 in vernier time selection circuit 230. In this way, one path selector is enabled independent of the operation of counter 220. The A2' bit from latch 222 is also applied to the gate electrode of transistor 258 and to the input of inverter 265. The output of inverter 265 is coupled to the gate electrode of transistor 262. If the A2 bit is a "0", transistor 258 is enabled and transistor 262 is disabled. Consequently, only a path from terminal 281 to ground can be enabled. In the event that the A2 bit is a "1", transistor 258 is disabled while transistor 262 is enabled. As a result, only a path from terminal 283 to ground can be enabled.

In the present example, the A0 and A1 bits are "1"s and the A2 bit is a "0". As soon as latch 222 is set, path selector 233-4 is enabled so that line 228-4 is connected to the drain electrode of transistor 251. When counter 220 is decremented to zero, a positive going zero count signal is applied to the gate electrode of transistor 251 and the drain electrode thereof is discharge through enabled transistors 251 and 258. The voltage on line 228-4 then starts discharging just prior to time t6 as shown in waveform 310. Column control line 285, however, remains charged at the +VCC level until vernier time selector 230-4 is enabled at time t8 at the beginning of the fourth vernier timing signal (waveform 330 in FIG. 3) after the zero count pulse. At time t11, column control line 285 reaches ground potential through vernier time selector 230-4, path selector 233-4 and transistors 251 and 258 as shown in waveform 355. The gate electrode of transistor 236 is then at a "0" level and transistor 236 is disabled by the "0" on its gate electrode. As is readily apparent, the vernier time selection divides each interval of counter 220 into four precisely defined signals so that an accurate timing is achieved even though the transition times of vernier time selectors 230-1 through 230-8 may be significantly longer than the vernier time spacing.

Figure 4:
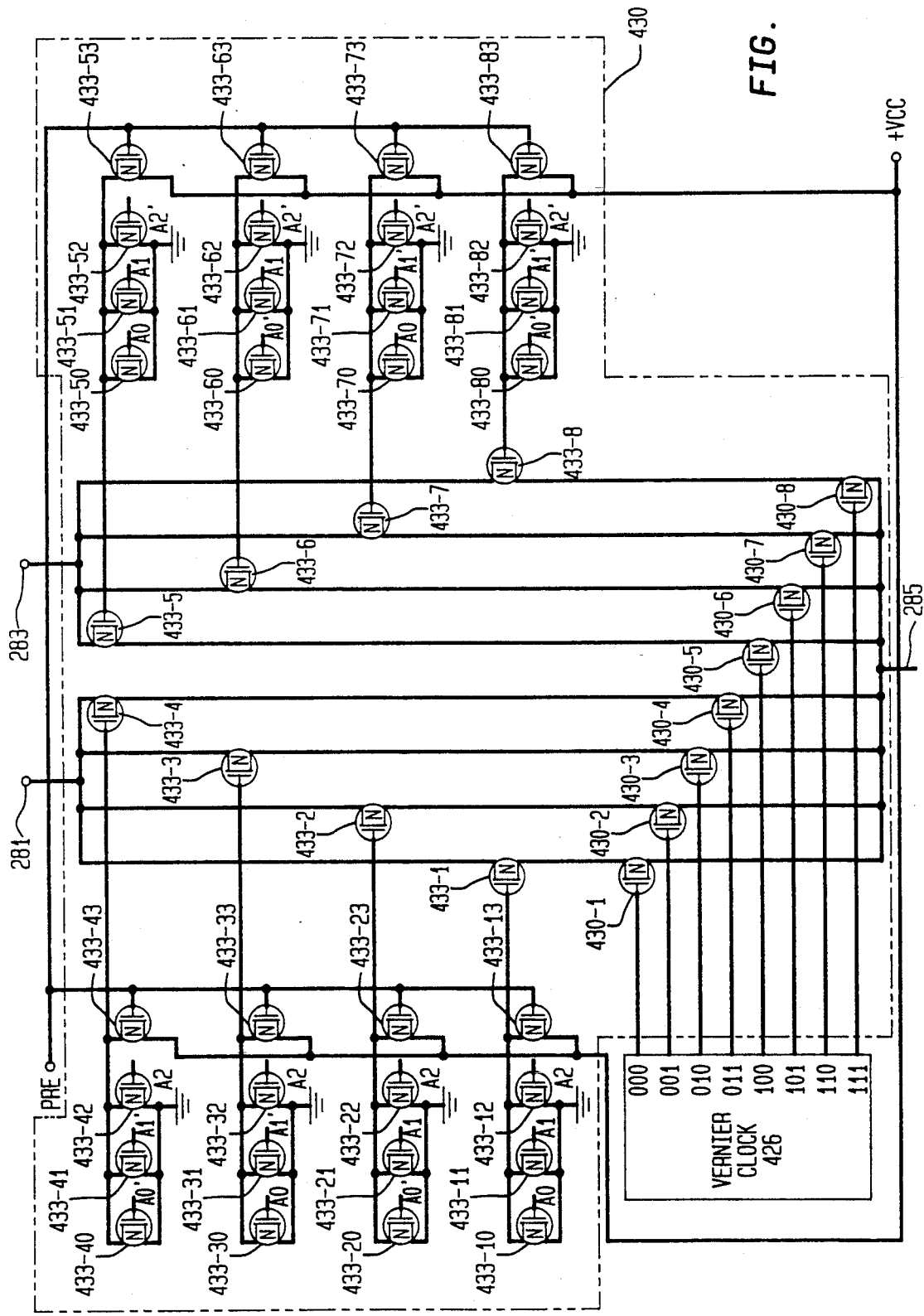
FIG. 4 is a detailed block and schematic diagram of one embodiment of the vernier timing selection circuit of FIG. 2 in accordance with the present invention.

Referring to FIG. 4, there is shown a block and schematic diagram of one embodiment of a vernier timing selection circuit 430 (shown within the dashed line box) which is useful as vernier timing selection circuit 230 of FIG. 2 and a vernier clock 426 which is useful as vernier clock 226 of FIG. 2. Vernier timing selection circuit 430 comprises n-channel transistors 430-1 through 430-8 which correspond to vernier time selectors 230-1 through 230-8 in FIG. 2. Vernier timing selection circuit 430 further comprises n-channel transistors 433-1, 433-10, 433-11, 433-12 and 433-13 which form a path selector corresponding to path selector 233-1 in FIG. 2, n-channel transistors 433-2, 433-20, 433-21, 433-22 and 433-23 which form a path selector corresponding to path selector 233-2 in FIG. 2, n-channel transistors 433-3, 433-30, 433-31, 433-32 and 433-33 which form a path selector corresponding to path selector 233-3 in FIG. 2, n-channel transistors 433-4, 433-40, 433-41, 433-42 and 433-43 which form a path selector corresponding to path selector 233-4 in FIG. 2, n-channel transistors 433-5, 433-50, 433-51, 433-52 and 433-53 which form a path selector corresponding to path selector 233-5 in FIG. 2, n-channel transistors 433-6, 433-60, 433-61, 433-62 and 433-63 which form a path selector corresponding to path selector 233-6 in FIG. 2, n-channel transistors 433-7, 433-70, 433-71, 433-72 and 433-73 which form a path selector corresponding to path selector 233-7 in FIG. 2 and n-channel transistors 433-8, 433-80, 433-81, 433-82 and 433-83 which form a path selector corresponding to path selector 233-8 in FIG. 2.

In vernier time selection circuit 430 of FIG. 4, the drain electrodes of transistors 430-1 through 430-8 are coupled to the column control line 285. The 000 output of clock 426 is coupled to the gate electrode of transistor 430-1 and the source electrode of transistor 430-1 is coupled to the drain electrode of transistor 433-1. The 001 output of clock 426 is coupled to the gate electrode of transistor 430-2, and the source electrode of transistor 430-2 is coupled to the drain electrode of transistor 433-2. The 010 output of clock 426 is coupled to the gate electrode of transistor 430-3, and the source electrode of transistor 430-3 is coupled to the drain electrode of transistor 433-3. The 011 output of clock 426 is coupled to the gate electrode of transistor 430-4, and the source electrode of transistor 430-4 is coupled to the drain electrode of transistor 433-4.

The 100 output of clock 426 is coupled to the gate electrode of transistor 430-5, and the source electrode of transistor 430-5 is coupled to the drain electrode of transistor 433-5. The 101 output of clock 426 is coupled to the gate electrode of transistor 430-6, and the source electrode of transistor 430-6 is coupled to the drain electrode of transistor 433-6. The 110 output of clock 426 is coupled to the gate electrode of transistor 430-7, and the source electrode of transistor 430-7 is coupled to the drain electrode of transistor 433-7. The 111 output of clock 426 is coupled to the gate electrode of transistor 430-8, and the source electrode of transistor 430-8 is coupled to the drain electrode of transistor 433-8.

The source electrodes of transistors 433-10, 433-11 and 433-12 are connected to ground potential. The drain electrode of transistor 433-13 is connected to the positive voltage source +VCC. The source electrode of transistor 433-13 and the drain electrodes of transistors 433-10, 433-11 and 433-12 are coupled to the gate electrode of transistor 433-1. The source electrode of transistor 433-1 is coupled to terminal 281. The source electrodes of transistors 433-20, 433-21 and 433-22 are connected to ground potential. The drain electrode of transistor 433-23 is connected to the positive voltage source +VCC. The source electrode of transistor 433-23 and the drain electrodes of transistors 433-20, 433-21 and 433-22 are coupled to the gate electrode of transistor 433-2. The source electrode of transistor 433-2 is coupled to terminal 281.

The source electrodes of transistors 433-30, 433-31 and 433-32 are connected to ground potential. The drain electrode of transistors 433-33 is connected to the positive voltage source +VCC. The source electrode of transistor 433-33 and the drain electrodes of transistors 433-30, 433-31 and 433-32 are coupled to the gate electrode of transistor 433-3. The source electrode of transistor 433-3 is coupled to terminal 281. The source electrodes of transistors 433-40, 433-41 and 433-42 are connected to ground potential. The drain electrode of transistor 433-43 is connected to the positive voltage source +VCC. The source electrode of transistor 433-43 and the drain electrodes of transistors 433-40, 433-41 and 433-42 are coupled to the gate electrode of transistor 433-4. The source electrode of transistor 433-4 is coupled to terminal 281.

The source electrodes of transistors 433-50, 433-51 and 433-52 are connected to ground potential. The drain electrode of transistor 433-53 is connected to the positive voltage source +VCC. The source electrode of transistor 433-53 and the drain electrodes of transistors 433-50, 433-51 and 433-52 are coupled to the gate electrode of transistor 433-5. The source electrode of transistor 433-5 is coupled to terminal 283. The source electrodes of transistors 433-60, 433-61 and 433-62 are connected to ground potential. The drain electrode of transistor 433-63 is connected to the positive voltage source +VCC. The source electrode of transistor 433-63 and the drain electrodes of transistors 433-60, 433-61 and 433-62 are coupled to the gate electrode of transistor 433-6. The source electrode of transistor 433-6 is coupled to terminal 283.

The source electrodes of transistors 433-70, 433-71 and 433-72 are connected to ground potential. The drain electrode of transistor 433-73 is connected to the positive voltage source +VCC. The source electrode of transistor 433-73 and the drain electrodes of transistors 433-70, 433-71 and 433-72 are coupled to the gate electrode of transistor 433-7. The source electrode of transistor 433-7 is coupled to terminal 283. The source electrodes of transistors 433-80, 433-81 and 433-82 are connected to ground potential. The drain electrode of transistor 433-83 is connected to the positive voltage source +VCC. The source electrode of tansistor 433-83 and the drain electrodes of tansistors 433-80, 433-81 and 433-82 are coupled to the gate electrode of transistor 433-8. The source electrode of transistor 433-8 is coupled to terminal 283.

To illustrate the operation of the path selectors of FIG. 4, consider, for example, the path selector corresponding to path selector 233-1 of FIG. 2. This path selector comprises the transistor 433-1 which opertes to complete the path from the source electrode of transistor 430-1 to terminal 281 in response to the "0" A0, A1 and A2 outputs of latch 222 in FIG. 2. Transistor 433-1 is enabled by the +VCC voltage at is gate electrode when the A0, A1 and A2 outputs of latch 222 are "0"s. The A0, A1 and A2 bits are coupled from the latch 222 (shown in FIG. 2) to the gate electrodes of transistors 433-10, 433-11 and 433-12, respectively, and these transistors form an NAND gate. The drain electrodes of transistors 433-10, 433-11 and 433-12 are connected to the gate electrode of transistor 433-1. The source electrodes of transistors 433-10, 433-11 and 433-12 are connected to a ground potential. When the precharge pulse PRE is coupled to the gate electrode of transistor 433-13, the positive voltage +VCC is coupled to the gate electrode of transistor 433-1 through transistor 433-13. If any of the A0, A1 or A2 bit signals applied to the gate electrodes of transistors 433-10, 433-11 or 433-12 from latch 222 of FIG. 2 is a "1", the gate electrode of transistor 433-1 is discharged to ground and transistor 433-1 is disabled. When the A0, A1 and A2 bits are all "0"s, the gate electrode of transistor 433-1 remains at the positive voltage +VCC and transistor 433-1 is enabled. The precharge and NAND gate arrangements for transistors 433-2 through 433-8 operate in substantially the same way except that different A0, A1 and A2 outputs of latch 222 are applied to the associated NAND gate transistors.

Each of the NAND gates associated with transistors 433-1 through 433-8 receives a different combination of A0, A1 and A2 bits from latch 222. Since a different combination of A0, A0', A1, A1', A2 and A2' bits is coupled to each path selector, only one of transistors 433-1 through 433-8 is enabled by the A0, A0', A1, A1', A2 and A2' outputs of latch 222 of FIG. 2. Transistor 433-2 is enabled only when the A0', A1 and A2 outputs of latch 222 of FIG. 2 are "0"s. Transistor 433-3 is enabled only by "0" A0, A1' and A2 outputs of latch 222 of FIG. 2. Transistor 433-4 is enabled only by the "0" A0', A1' and A2 outputs of latch 222 of FIG. 2. Transistor 433-5 is enabled only by the "0" A0, A1 and A2' outputs of latch 222 of FIG. 2. Transistor 433-6 is enabled only by the "0" A0', A1 and A2' outputs of latch 222 of FIG. 2. Transistor 433-7 is enabled only by the "0" A0, A1' and A2' outputs of latch 222 of FIG. 2 and transistor 433-8 is enabled only by the "0" A0', A1' and A2' outputs of latch 222 of FIG. 2.

In the event that the A0 and A1 bits from latch 222 are "1"s set by precharge pulse PRE and the A2 bit therefrom is a "0", the drain electrodes of transistors 433-40, 433-41 and 433-42 are set to and remain at the +VCC level (a "1") after precharge pulse PRE. Transistor 433-4 is enabled so that only the path from the drain electrode of transistor 430-4 to terminal 281 is enabled. Applying the A2 and A2' bit outputs of latch 222 to the NAND gates of path selectors 433-1 through 433-8 prevents the concurrent enabling of a path selected from the group including path selectors 433-1 through 433-4 and a path selected from the group including path selectors 433-5 through 433-8 in the same intervale between decrement clock pulses.

Figure 5:
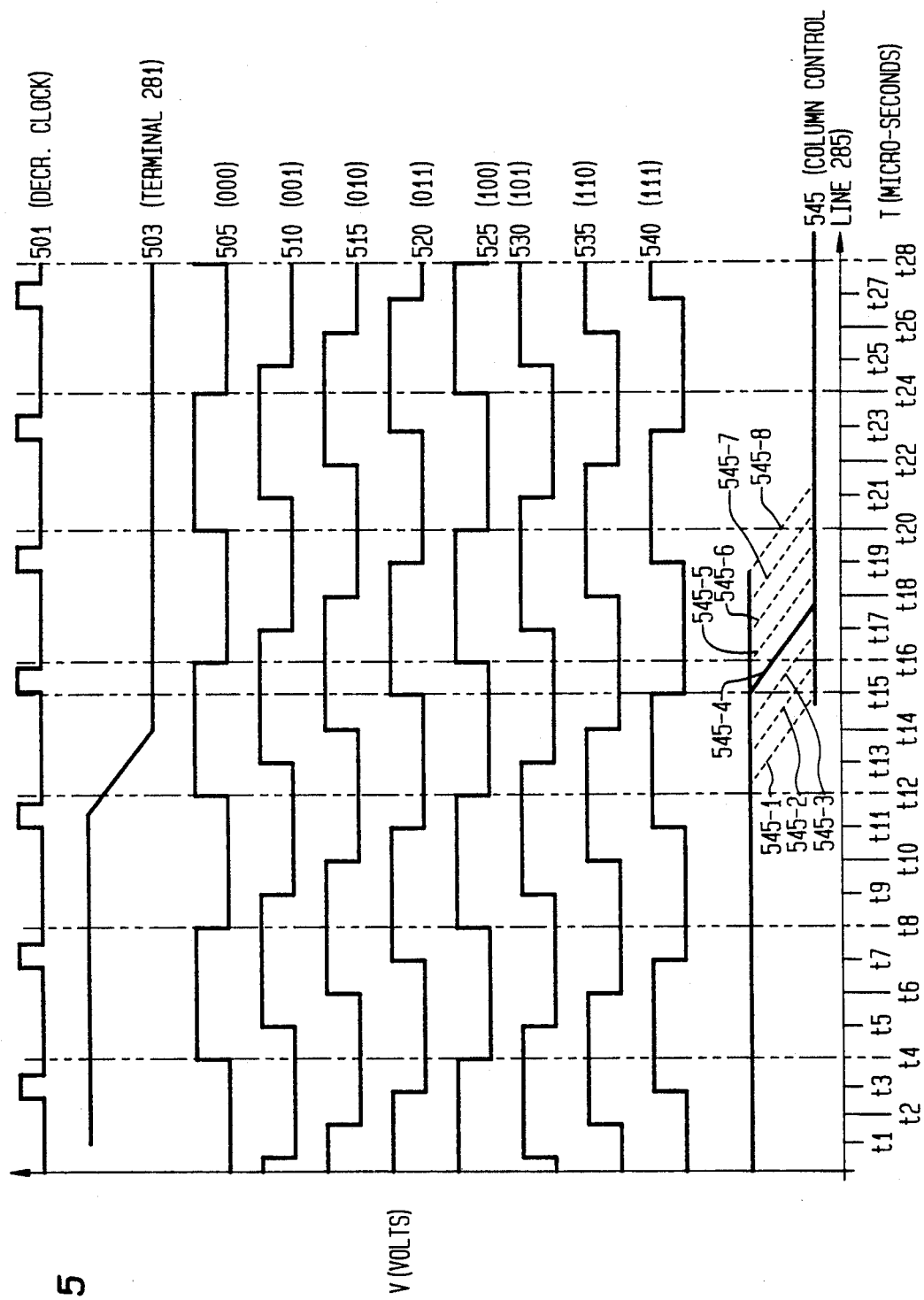
FIG. 5 is a timing diagram illustrating the operation of the embodiment of the vernier timing selection embodiment of FIG. 4.

FIG. 5 illustrtes the operation of clock 426 and vernier timing selection circuit 430. In FIG. 5, the waveforms are shown with voltage V (volts) on the y axis and time (microseconds) on the x axis. To make the operation clearer, each of the waveforms has essentially the same amplitude and the same "1" and "0" levels. The 000 through 111 ouputs of vernier clock 426 are shown in waveforms 505 through 540, respectively. The 000 to 111 clock outputs shown on FIG. 5 occur at regularly spaced timing intervals in two successive decrement clock pulse intervals. The sequence of 000 through 011 vernier clock pulses occur in one interval between decrement clock pulses while the 100 through 111 vernier clock pulses occur in the immediately succeeding interval between decrement clock pulses. The 000 through 111 outputs of clock 436 are coupled to the gate electrodes of transistors 430-1 through 430-8, respectively. In the count interval from t4 to t8, transistors 430-1 through 430-8 are sequentially enabled at time t4, t5, t6, and t7. Transistors 430-5 through 430-8 are sequentially enabled at times t8, t9, t10 and t11 in the next succeeding count interval between times t8 and t12. Each of these times defines a vernier timing interval at which the path from column control line 285 to ground can be enabled to discharge the column control line. The sequence of vernier timing signals is repeated between times t12 and t20 and between times t20 and t28 in FIG. 5.

Prior to the start of the ramp signal from analog signal generator 240 in FIG. 2, precharge signal PRE enables path selection transistors 433-13, 433-23, 433-33, 433-43, 433-53, 433-63, 433-73 and 433-83 in FIG. 4 so that the gate electrodes of transistors 433-1 through 433-8 are charged to their "1" levels. Where the A0, A1 and A2 bit signals from latch 222 in FIG. 2 form a 011 code, the gate electrodes of transistors 433-40, 433-41 and 433-42 in FIG. 4 receive "0" signals and the gate electrode of transistor 433-4 remains at the "1" level set by signal PRE. The gate electrodes of the other path selection transistors i.e. 433-1 through 433-3 and 433-5 through 433-8 revert to their "0" levels in response to the A0, A1 and A2 bit combinations applied to the NAND gate transistors associated therewith.

When counter 220 of FIG. 2 is decremented to zero, terrminal 281 is discharged to ground potential through transistors 251 and 258 as previously described with respect to FIG. 2. The discharge of terminal 281 is illustrated in waveform 503 of FIG. 5 at time t12. Transistor 430-4, which has its drain electrode connected to cloumn control line 285 and its source electrode connected to enabled transistor 433-4, starts to conduct at time t15 in response to the 011 vernier clock signal shown in waveform 520. The transistion portion of column control line 285 for the 011 vernier clock singal shown in transition portion 545-4 of waveform 545 starts at time t15 and ends by time t18. As a result, column control line 285 is discharged through transistors 430-4 and 433-4 of FIG. 4 and transistors 251 and 285 of FIG. 2. Waveform 545 also illustrates the transition portions for other values of the A0, A1 and A2 of waveform 545 shown as dashed lines 545-1, 545-2, 545-3, 545-5, 545-6, 545-7 and 545-8. Since the A2 output of latch 222 of FIG. 2 is a "0", transistor 258 is enabled and transistor 262 is disabled. Only the paths through vernier timing circuit 430 between column control line 285 and terminal 281 are effective to discharge column control line 285. In accordance with the present invention, each interval between decrement clock pulses is divided into vernier timing intervals so that accurate timing is obtained with greatly reduced counting rates.

Figure 6:
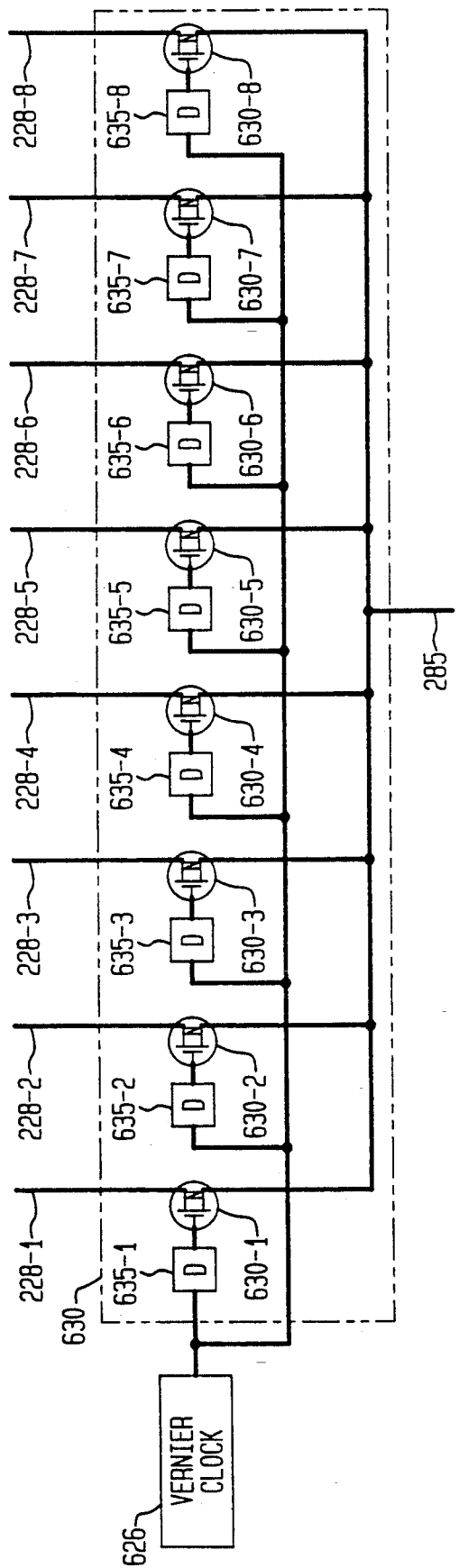
FIG. 6 is a detailed block and schematic diagram of another embodiment of the vernier timing selection circuit of FIG. 2 in accordance with the present invention.

Referring to FIG. 6, there is shown vernier clock 626 and a vernier time selector circuit 630 (within the dashed rectangle) which is usedful as the vernier timing slection circuit 230 of FIG. 2. The circuit 630 comprises field effect transistors 630-1, 630-2, 630-3, 630-4, 630-5, 630-6, 630-7 and 630-8 and delay elements (D) 635-1, 635-2, 635-3, 635-4, 635-5, 635-6, 635-7 and 635-8. The drain electrodes of transistors 630-1 through 630-8 are coupled to the column control line 285. The source electrod of transistor 630-1 is coupled to line 228-1 in FIG. 2. The source electrode of transistor 630-2 is coupled to line 228-2 in FIG. 2. The source electrode of transistor 630-3 is coupled to line 228-3 in FIG. 2. The source electrode of transistor 630-4 is coupled to line 228-4 in FIG. 2. The source electrode of transistor 630-5 is coupled to line 228-5 in FIG. 2. The source electrode of transistor 630-6 is coupled to line 228-6 in FIG. 2. The source electrode of transistor 630-7 is coupled to line 228-7 in FIG. 2 and the source electrode of transistor 630-8 is coupled to line 228-8 in FIG. 2.

An output of vernier clock 626 is coupled to an input of each of delay elements 635-1, 635-2, 635-3, 635-4, 635-5, 635-6, 635-7 and 635-8. An output of delay element 635-1 is coupled to the gate electrode of transistor 630-1. An output of delay element 635-2 is coupled to the gate electrode of transistor 630-2. An output of delay element 635-3 is coupled to the gate electrode of transistor 630-3. An output of delay element 635-4 is coupled to the gate electrode of transistor 630-4. An output of delay element 635-5 is coupled to the gate electrode of transistor 630-5. An output of delay element 635-6 is coupled to the gate electrode of transistor 630-6. An output of delay element 635-7 is coupled to the gate electrode of transistor 630-7 and the output of delay element 635-8 is coupled to the gate electrode of transistor 630-8.

Figure 7:
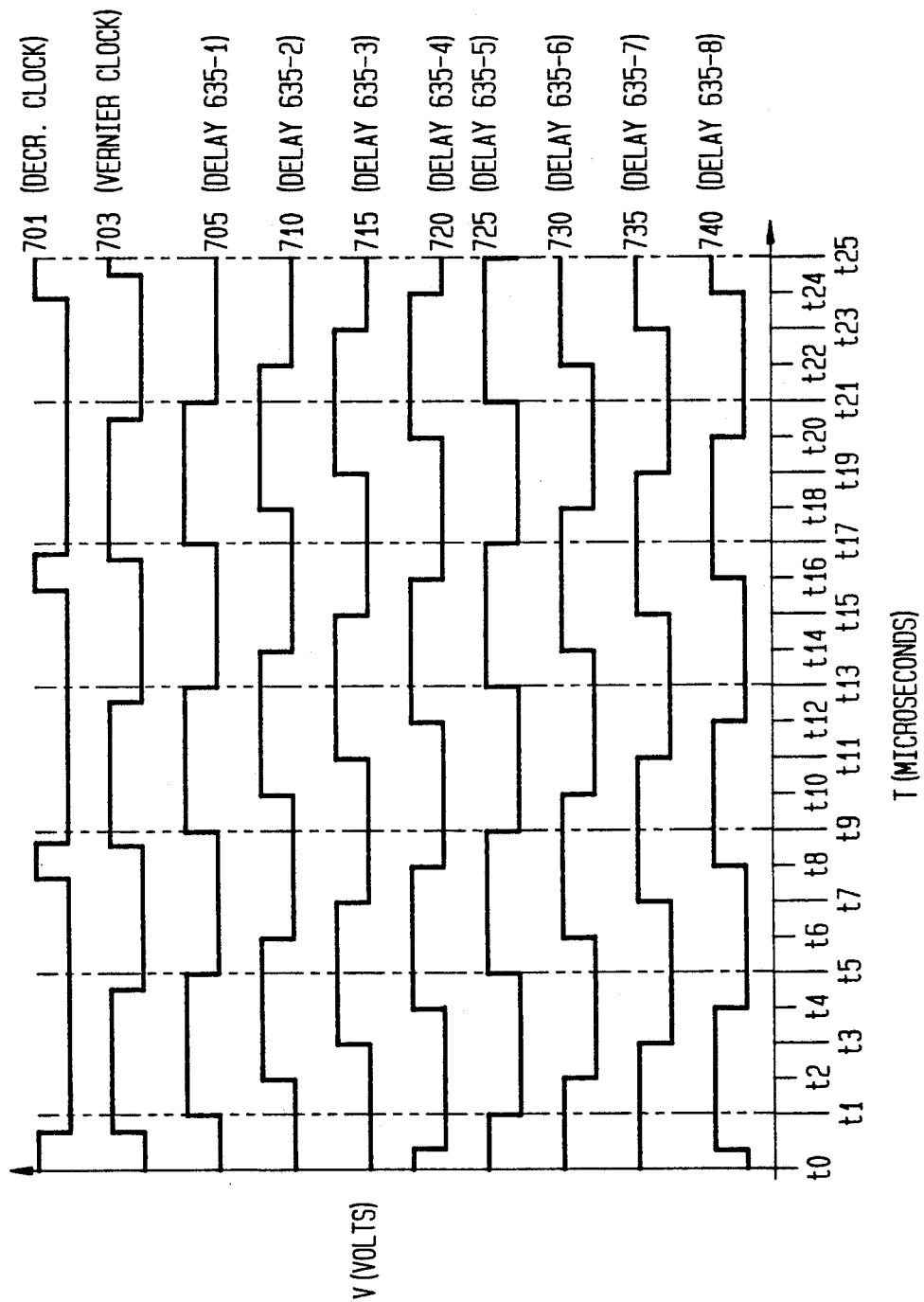
FIG. 7 is a timing diagram illustrating the operation of the vernier timing selection embodiment of FIG. 6.

FIG. 7 shows waveforms illustrating the operation of the vernier timing selectors in successive count intervals of the counter 220 of FIG. 2. In FIG. 7, the waveforms are shown with voltage V (volts) on the y axis and time (microseconds) on the x axis. To make the operation clearer, each of the waveforms has essentially the same amplitude and the same "1" and "0" levels. A vernier timing cycle extends over two successive count intervals so that every alternate decrement clock pulse shown in waveform 701 triggers the generation of a vernier clock pulse from vernier clock 626 shown in waveform 703. The first vernier timing cycle in FIG. 7 extends between times t1 and t10 and provides eight vernier timing intervals over two decrement clock define count intervals. The subsequent vernier timing cycles occur between times t10 and t18, and between times t18 and t25. During each vernier timing cycle, vernier clock 626 generates a "1" pulse shown in waveform 703 which in turn produces the successively delayed pulses at the outputs of delay element 635-1 thorugh 635-8 shown in waveforms 705 through 740, respectively. Referring to FIGS. 6 and 7, vernier clock 626 applies a positive pulse (waveform 703) to the input of delay element 635 in response to each alternate output pulse (waveform 701) from decrement clock 212 of FIG. 2. The delayed output of delay element 635-1 (waveform 705) is coupled to the gate electrode of transistor 630-1. Transistor 630-1 is enabled to generate the first vernier timing signal of each vernier timing cycle e.g. t1 in the first count interval.

The gate electrode of transistor 630-2 receives the pulse from clock 626 through delay 635-2 and is enabled to provide the second vernier timing signal, e.g. t2 in vernier timing cycle by the positive transition of the pulse shown in waveform 710. Delay 635-2 is selected so that the pulse therefrom produces the second vernier timing instant of each vernier timing cycle. Column control line 285 is thereby connected to line 128-2 through transistor 630-2 to produce the second vernier timing signal (e.g., time t2) of each vernier timing cycle. Similarly, the gate electrode of transistor 630-3 receives the pulse from clock 626 through delay 635-3 and is enabled at time t3 in the first vernier timing cycle by the positive transition of the pulse shown in waveform 720. Delay 635-3 is selected so that the pulse therefrom starts the third vernier timing signal of each vernier timing cycle. Column control line 285 is thereby connected to line 128-3 through transistor 630-3 to generate the third vernier timing signal (e.g. time t3) of the each vernier timing cycle.

Transistors 630-4, 630-5, 630-6, 630-7 and 630-8 are successively enabled by the pulses at the outputs of delays 635-4, 635-5, 635-6, 635-7 and 635-8. The pulse applied to the gate electrodes of transistors 630-4, 630-5, 630-6, 630-7 and 630-8 are shown in waveforms 720, 725, 730, 735 and 740, respectively. In this way, column control line 285 is connected to lines 128-4, 128-5, 128-6, 128-7 and 128-8 at the successive time signals, e.g. times t4, t5, t6, t7 and t8, of each vernier timing cycle. Only one of lines 128-1 through 128-8 is coupled to ground potential in response to the A0, A1 and A2 bits stored in latch 222 after counter 220 is decremented to zero. The discharge of column control line 285 is thereby accurately controlled in accordance with the state of latch 222 and the decrementing of counter 220 in FIG. 2.

Figure 8:
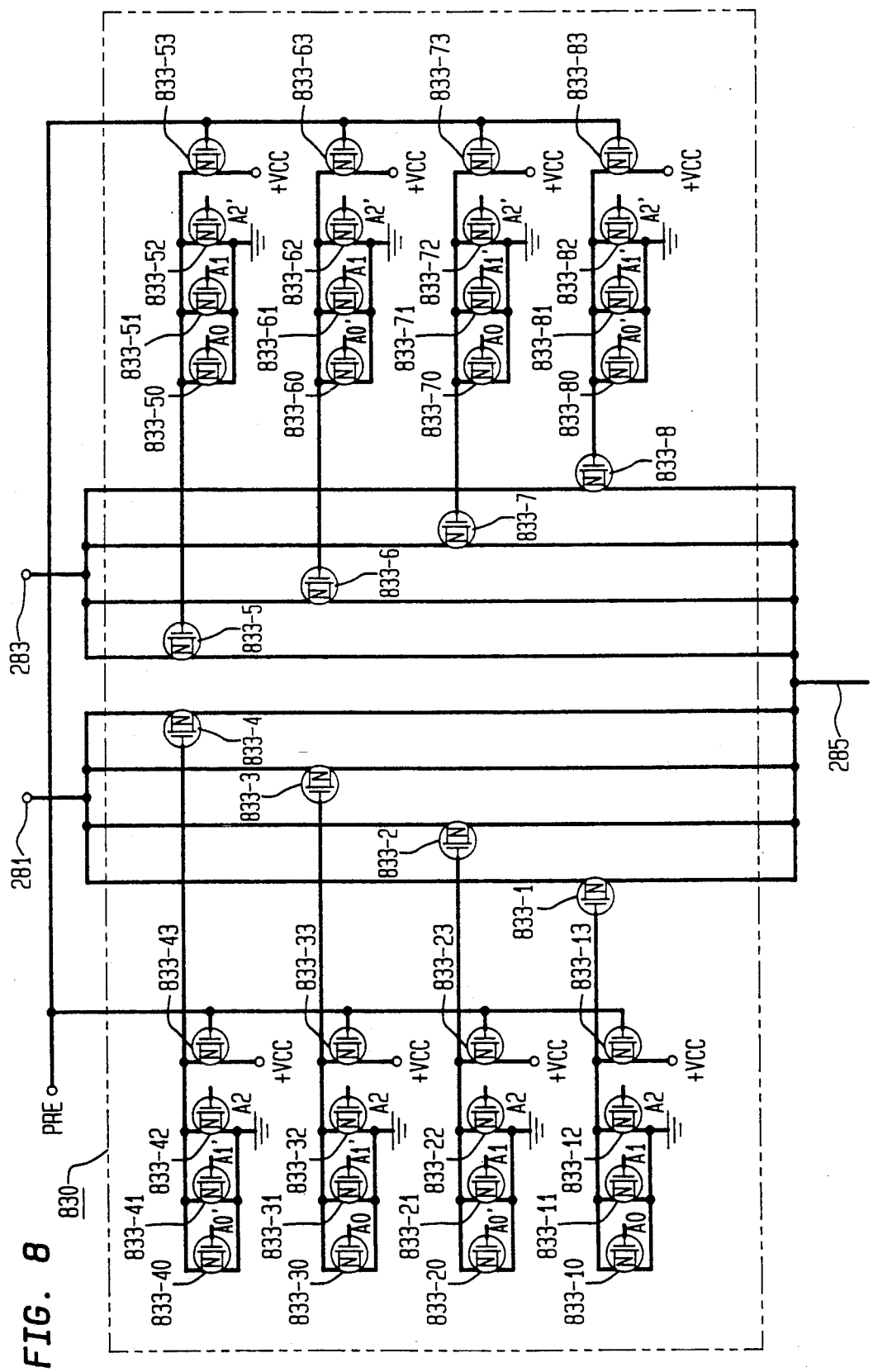
FIG. 8 is a detailed schematic diagram of yet another embodiment of the vernier timing selection circuit of FIG. 2.

Referring to FIG. 8, there is shown a schematic diagram of another embodiment of a vernier timing selection circuit 830 which is useful as the vernier timing circuit 200 of FIG. 2. The circuit comprises vernier timing selection circuit 830 shown enclosed within a dashed line rectangle. Vernier timing selectio circuit 830 includes n-channel transistors 833-1, 833-10, 833-11, 833-12 and 833-13, n-channel transistors 833-2, 833-20, 833-21, 833-22 and 833-23, n-channel transistors 833-3, 833-30, 833-31, 833-32 and 833-33, n-channel transistors 833-4, 833-40, 833-41, 833-42 and 833-43, n-channel transistors 833-5, 833-50, 833-51, 833-52 and 833-53, n-channel transistors 833-6, 833-60, 833-61, 833-62 and 833-63, n-channel transistors 833-7, 833-70, 833-71, 833-72 and 833-73 and n-channel transistors 833-8, 833-80, 833-81, 833-82 and 833-83.

In vernier time selection circuit 830, the drain electrodes of transistors 833-1 through 833-8 are coupled directly to column control line 285. The source electrodes of transistors 833-1 through 833-4 are coupled to terminal 281. The source electrodes of transistors 833-5 through 833-8 are coupled to terminal 283. The source electrodes of transistors 833-10, 833-11 and 833-12 are connected to ground potential. The drain electrodes of transistor 833-13 is connected to the positive voltage source +VCC. The source electrode of transistor 833-13 and the drain electrodes of transistors 833-10, 833-11 and 833-12 are coupled to the gate electrode of transistors 833-1. The source electrode of transistor 833-1 is coupled to terminal 281. The source electrode of transistors 833-20, 833-21 and 833-22 are connected to ground potential. The drain electrode of transisotr 833-23 is connected to the positive voltage source +VCC. The source electrode of transistor 833-23 and the drain electrodes of transistors 833-20, 833-21 and 833-22 are coupled to the gate electrode of transistor 833-2. The source electrode of transistor 833-2 is coupled to terminal 281.

The source electrodes of transistors 833-30, 833-31 and 833-32 are connected to ground potential. The drain electrode of transistor 833-33 is connected to the positive voltage source +VCC. The source electrode of transistor 833-33 and the drain electrodes of transistors 833-30, 833-31 and 833-32 are coupled to the gate electrode of transistor 833-3. The source electrode of transistor 833-3 is coupled to terminal 281. The source electrodes of transistors 833-40, 833-41 and 833-42 are connected to ground potential. The drain electrode of transistor 833-43 is connected to the positive voltage source +VCC. The source electrode of transistor 833-43 and the drain electrodes of transistors 833-40, 833-41 and 833-42 are coupled to the gate electrode of transistor 833-4. The source electrode of transistors 833-4 is coupled to terminal 281.

The source electrodes of transistors 833-50, 833-51 and 833-52 are connected to ground potential. The drain electrode of transistor 833-53 is connected to the positive voltage source +VCC. The source electrode of transistor 833-53 and the drain electrodes of transistors 833-50, 833-51 and 833-52 are coupled to the gate electrode of transistor 833-5. The source electrode of transistor 833-5 is coupled to terminal 283. The source electrodes of transistors 833-60, 833-61 and 833-62 are connected to ground potential. The drain electrode of transistor 833-63 is connected to the positive voltage source +VCC. The source electrode of transistor 833-63 and the drain electrodes of transistors 833-60, 833-61 and 833-62 are coupled to the gate electrode of transistor 833-6. The source electrode of transistor 833-6 is coupled to terminal 283.

The source electrodes of transistors 833-70, 833-71 and 833-72 are connected to ground potential. The drain electrode of transistor 833-73 is connected to the positive voltage source +VCC. The source electrode of transistor 833-73 and the drain electrodes of transistors 833-70, 833-71 and 833-72 are coupled to the gate electrode of transistor 833-7. The source electrode of transistor 833-7 is coupled to terminal 283. The source electrodes of transistors 833-80, 833-81 and 833-82 are connected to ground potential. The drain electrode of transistor 833-83 is connected to the positive voltage source +VCC. The source electrode of transistor 833-83 and the drain electrodes of transistors 833-80, 833-81 and 833-82 are coupled to the gate electrode of transistor 833-8. The source electrode of transistor 833-8 is coupled to terminal 283.

Transistors 833-1 through 833-8 in FIG. 8 operate as switching elements to selectively connect column control line 285 to either terminal 281 or 283 in response to the A0, A0', A1, A1', A2 and A2' outputs of latch 222 in FIG. 2 with the substantially the same gating arrangements described with respect to FIG. 4.

Instead of using a vernier clock and vernier timing transistors to generate the sequence of vernier timing signals as in FIG. 4, transistors 833-1 through 833-8 of FIG. 8 are fabricated to have different delay characteristics so that the time to discharge column control line 285 when the zero count signal from counter 220 enables transistors 251 and 254 in FIG. 2 is different for each transistor. For example, transistors 833-1 through 833-4 may be construced with channel widths of 300 microns, 150 microns, 100 microns and 80 microns, respectively, to obtain different dicharge times when transistors 251 and 254 of FIG. 2 are enabled. Consequently, the time to discharge column control line 285 through the path including transistors 833-1 may be set to obtain the first vernier time. The time to discharge column control line 285 through the path including transistor 833-2 may be set to provide the second vernier time. The time to discharge the path including transistor 833-3 may be set to provide the third vernier time and the time to discharge the path including transistor 833-4 may be set to provide the fourth vernier time. Transistors 833-5 through 833-8 may also be constructed with channel widths of 300 microns, 150 microns, 100 microns and 80 microns, respectively, so that the fifth through eighth vernier timing signals are obtained when transistors 254 and 262 of FIG. 2 are enabled.

Consider, for example, the selection of transistor 833-1 in FIG. 8. Transistor 833-1 completes the path from column control line 285 to terminal 281 in response to the "0" A0, A1 and A2 outputs of latch 222 in FIG. 2. The A0, A1 and A2 bits are coupled from latch 222 to the gate electrodes of transistors 833-10, 833-11 and 833-12, respectively. Transistors 833-10, 833-11 and 833-12 form an NAND gate that controls the enabling of transistor 833-1. The drain electrodes of transistors 833-10, 833-11 and 833-12 are connected to the gate electrode of the transistor 833-1. The source electrodes of transistors 833-10, 833-11 and 833-12 are connected to ground potential. When the precharge pulse PRE is coupled to the gate electrode of transistor 833-13, the positive voltage +VCC is coupled to the gate electrode of the transistor 833-1 through transistor 833-13. If any of the A0, A1 or A2 bit signals applied to the gate electrodes of transistors 833-10, 833-11 or 833-12 from latch 222 of FIG. 2 is a "1", the gate electrode of the transistor 833-1 is discharge through one of transistors 833-10, 833-11 or 833-12 and transistor 833-1 is disabled. When the A0, A1 and A2 bits are all "0"s, the gate electrode of transistor 833-1 remains at the positive voltage +VCC and transistor 833-1 is enabled. The precharge and NAND gate arrangements for transistors 833-2 through 833-8 operate in substantially the same way.

Each of the NAND gates associated with transistors 833-1 through 833-8 receives a different combination of A0, A1 and A2 bits from latch 222. Since a different combination of A0, A1 and A2 bits in coupled to each path selector, only one of transistors 833-1 through 833-8 is enabled by the A0, A1 and A2 outputs of latch 222 of FIG. 2. Transistor 833-2 is enabled only when the A0', A1 and A2 outputs of latch 222 of FIG. 2 are "0"s. Transistor 833-3 is enabled only by "0" A0, A1' and A2 outputs of latch 222 of FIG. 2. Transistor 833-4 is enabled only by the "0" A0', A1' and A2 outputs of latch 222 of FIG. 2. Transistor 833-5 is enabled only by the "0" A0, A1 and A2' outputs of latch 222 of FIG. 2.

Transistor 833-6 is enabled only by the "0" A0', A1 and A2' outputs of latch 222 of FIG. 2. Transistor 833-7 is enabled only by the "0" A0, A1' and A2' outputs of latch 222 of FIG. 2 and transistor 833-8 is enabled only by the "0" A0', A1' and A2' outputs of latch 222 of FIG. 2.

In the event that the A0 and A1 bits from latch 222 are "1"s and the A2 bit therefrom is a "0", the drain electrodes of transistor 833-40, 833-41 and 833-42 are at the +CVV ("1") voltage level set by precharge pulse PRE. Transistor 833-4 is enabled so that only the path from the drain electrode of transistor 430-4 to terminal 281 is enabled. Applying the A2 and A2' bit outputs of latch 222 of the NAND gates of path selectors 833-1 through 833-8 prevents the concurrent enabling of a path selected from the group including path selectors 833-1 through 833-4 and a path selected from the group including path selectors 833-5 through 833-8 in the same interval between decrement clock pulses.

Figure 9:
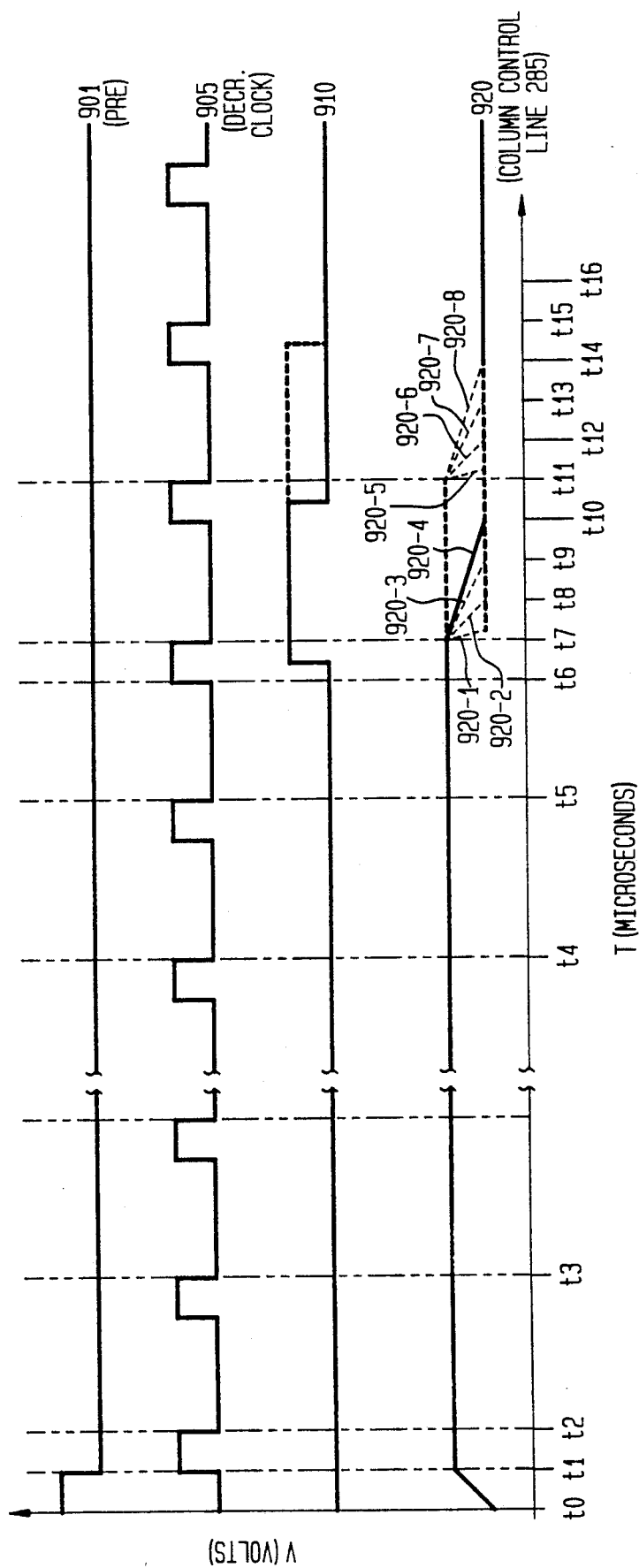
FIG. 9 is a timing diagram illustrating the operation of the vernier timing selection embodiment of FIG. 8.

FIG. 9 illustrates the operation of the vernier timing selection circuit 830. In FIG. 9, the waveforms are shown with voltage V (volts) on the y axis and time (microseconds) on the x axis. To make the operation clearer, each of the waveforms has essentially the same amplitude and the same "1" and "0" levels. Waveform 901 shows precharge pulse PRE which is applied to gate electrodes of transistors 833-13, 833-23, 833-33, 833-43, 833-53, 833-63, 833-73 and 833-83 to charge the gate electrodes of transistors 833-1 through 833-8 to their "1" levels at the beginning of each line scan. Waveform 905 shows the sequence of decrement pulses from decrement clock 212 of FIG. 2. Waveform 910 shows the zero count output pulse of counter 220 of FIG. 2 and waveform 920 shows the voltage on column control line 285 during a selected line scan. Since the A0', A1', and A2 bits from latch 222 are "0"s, only the gate electrode of transistor 833-4 remains at the "1" level and transistor 833-4 is enabled. The gate electrodes of transistors 833-1 through 833-3 and transistors 833-5 through 833-8 are discharged to their "0" levels and these transistors are disabled.

Counter 220 of FIG. 2, is set to value the A2, A3, A4 and A5 outputs of shift register 210 and the precharge pulse PRE of waveform 901 occurs between times t0 and t1. The counter 220 is decremented in successive count intervals, e.g. 4 microsecond intervals, by the decrement clock pulses shown in waveform 905 from decrement clock 212. Transistor 833-4 is enabled by the "0" A0', A1' and A2 outputs of latch 222 in FIG. 2 and transistor 258 in FIG. 2 is enabled by the "1" A2' output of latch 222 by time t1. The clock pulses from decrement clock 212 in FIG. 2 shown in waveform 905 reduce the count in counter 220 by one in each count interval between decrement clock pulses. Assume for purposes of illustration, that counter 220 is decremented to its zero state by the decrement clock pulse occurring at time t6. The zero count output of counter 220 (waveform 910) enables transistors 251 and 254 in FIG. 2 between times t6 and t7.

When transistor 251 is enabled, column control line 285 is coupled to ground potential through transistor 833-4 of FIG. 8 and transistors 251 and 258 of FIG. 2. Column control line 285 is discharged from the +VCC level to ground potential as shown in transition 920-4 of waveform 920. The discharge time is determined by the impedance of the discharge path through transistor 833-4 in FIG. 8 and transistors 251 and 258 in FIG. 2. Transistor 833-4 has its channel width set to discharge column control line 285 at the fourth vernier timing signal as illustrated in the transition 920-4 of waveform 920. In the event that the A0, A1 and A2 outputs of latch 222 of FIG. 2 selected transistor 833-1, its channel width causes the discharge of column control line 285 to follow the dashed line transition 920-1 of waveform 920 to reach ground potential at time t7, the first vernier timing signal. Dashed line transition 920-2 which results from the selection of transistor 833-2 reaches ground potential at t8 and dashed line transition 920-3 which occurs if transistor 833-3 is selected reaches ground potential at time t9. In this way, the count interval is accurately divided into four vernier timing signals by fabrication of 833-1 through 833-4 and 833-5 through 833-8 with different channel widths.

In the event that the A2 bit output of latch 222 in FIG. 2 is a "1", transistor 833-8 is enabled instead of transistor 833-4 and transistor 262 in FIG. 2 is enabled by the "1" A2 bit. Counter 220 is decremented to zero by the decrement clock pulse of waveform 905 occurring at time t10 and the zero count output from counter 220 occurs between times t10 and t11 as shown by the dashed line portion of waveform 910. Column control line 285 is discharged through transistors 833-8 of FIG. 8 and transistors 254 and 262 of FIG. 2 as indicated by the dashed line transition 920-8 of waveform 920. Dashed line transitions 920-5, 920-6 and 920-7 in waveform 920 indicate the discharge of column control line 285 if transistor 833-5, 833-6 or 833-7 is selected by the outputs of latch 222.

Figure 10:
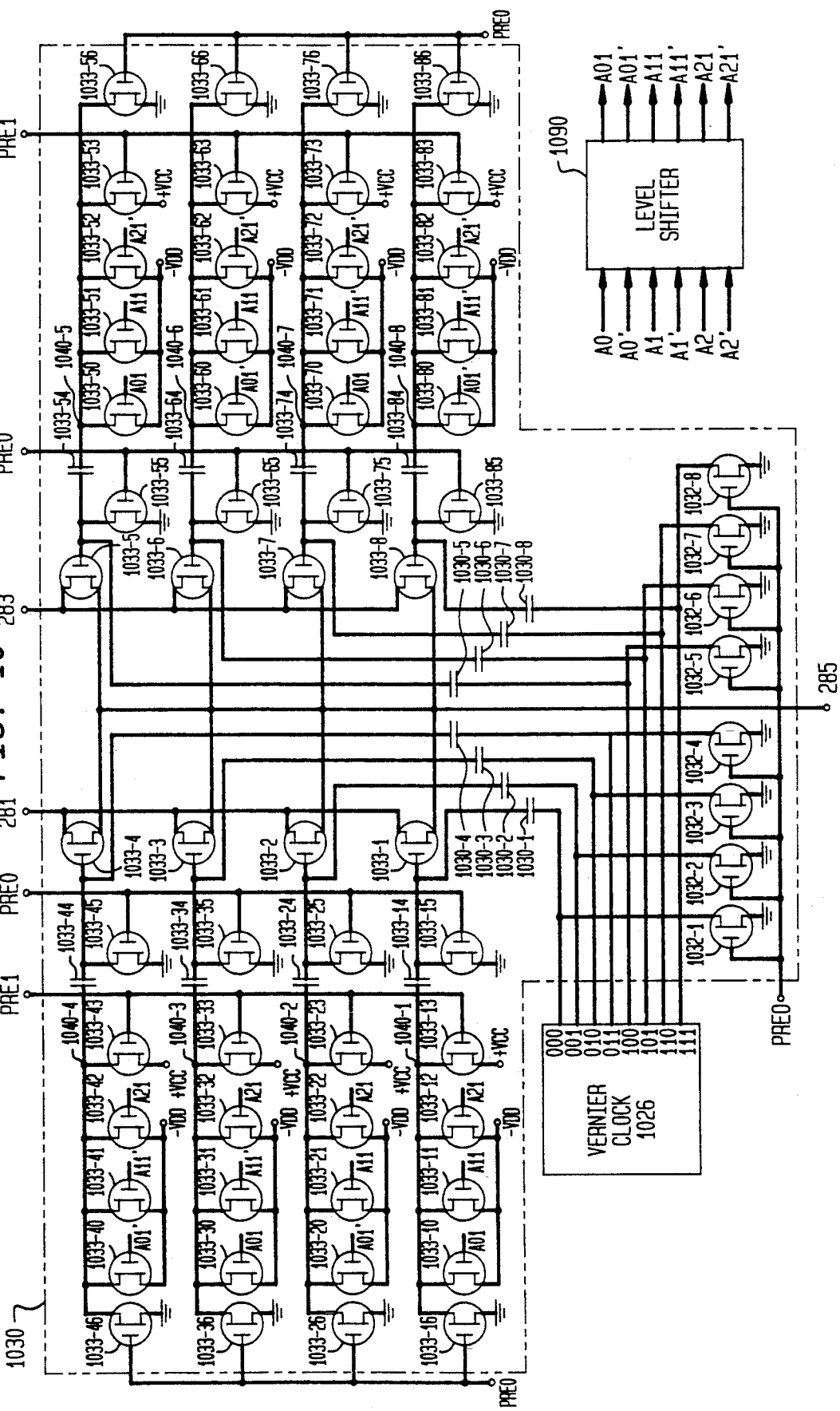
FIG. 10 is a detailed block and schematic diagram of yet another embodiment of the vernier timing selection circuit of FIG. 2.

Referring to FIG. 10, there is shown (within a dashed rectangle) a block and schematic diagram of a vernier timing selection circuit 1030 which is useful as the vernier timing selection circuit of FIG. 2. The circuit of FIG. 10 comprises vernier clock 1026, level shifter 1090, and vernier timing selection circuit 1030. Vernier timing selection circuit 1030 comprises capacitors 1030-1 through 1030-8 and n-channel transistors 1032-1 through 1032-8, n-channel transistors 1033-1, 1033-10, 1033-11, 1033-12, 1033-13, 1033-15 and 1033-16 and a capacitor 1033-14 which form a path selector corresponding to path selector 233-1 in FIG. 2, n-channel transistors 1033-2, 1033-20, 1033-21, 1033-22, 1033-23, 1023-25 and 1033-26 and a capacitor 1033-24 which form a path selector corresponding to path selector 233-2 in FIG. 2, n-channel transistors 1033-3, 1033-30, 1033-31, 1033-32, 1033-33, 1033-35 and 1033-36 and a capacitor 1033-34 which form a path selector corresponding to path selector 233-3 in FIG. 2, n-channel transistors 1033-4, 1033-40, 1033-41, 1033-42, 1033-43, 1033-45 and 1033-46 and a capacitor 1033-44 which form a path selector corresponding to path selector 233-4 in FIG. 2, n-channel transistors 1033-5, 1033-50, 1033-51, 1033-52, 1033-53, 1033-55 and 1033-56 and a capacitor 1033-54 which form a path selector corresponding to path selector 233-5 in FIG. 2, n-channel transistors 1033-6, 1033-60, 1033-61, 1033-62, 1033-63, 1033-65 and 1033-66 and a capacitor 1033-64 which form a path selector corresponding to path selector 233-6 in FIG. 2, n-channel transistors 1033-7, 1033-70, 1033-71, 1033-72, 1033-73, 1073-75 and 1033-76 and a capacitor 1033-74 which form a path selector corresponding to path selector 233-7 in FIG. 2 and n-channel transistors 1033-8, 1033-80, 1033-81, 1033-82, 1033-83, 1033-85 and 1033-86 and a capacitor 1033-84 which form a path selector corresponding to path selector 233-8 in FIG. 2.

In the vernier time selection circuit 1030 of FIG. 10, the drain electrodes of transistors 1033-1 through 1033-8 are coupled to column control line 285. The source electrodes of transistors 1033-1 through 1033-4 are coupled to terminal 281 and the source electrodes of transistors 1033-5 through 1033-8 are coupled to terminal 283. The 000 output of vernier clock 1026 is coupled to the gate electrode of transistor 1033-1 through a capacitor 1030-1. The 001 output of vernier clock 1026 is coupled to the gate electrode of transistor 1033-2 through a capacitor 1030-2. The 010 output of vernier clock 1026 is coupled to the gate electrode of transistor 1033-3 through a capacitor 1030-3. The 011 output of vernier clock 1026 is coupled to the gate electrode of transistor 1033-4 through a capacitor 1030-4. The 100 output of vernier clock 1026 is coupled to the gate electrode of transistor 1033-5 through a capacitor 1030-5. The 101 output of vernier clock 1026 is coupled to the gate electrode of transistor 1033-6 through a capacitor 1030-6. The 110 output of vernier clock 1026 is coupled to the gate electrode of transistor 1033-7 through a capacitor 1030-7. The 111 output of vernier clock 1026 is coupled to the gate electrode of transistor 1033-8 through a capacitor 1030-8. The A0, A1, A2, A0', A1' and A2' inputs of the level shifter 1090 are coupled to the outputs of latch 222 in FIG. 2.

The source electrodes of transistors 1032-1 through 1032-8 are coupled to a ground potential source. The gate electrodes of transistors 1032-1 through 1032-8 are coupled to a pulse input PRE0. The drain electrode of transistor 1032-1 is connected to the 000 output of vernier clock 1026. The drain electrode of transistor 1032-2 is connected to the 001 output of vernier clock 1026. The drain electrode of transistor 1032-3 is connected to the 010 output of vernier clock 1026. The drain electrode of transistor 1032-24 is connected to the 011 output of vernier clock 1026. The drain electrode of transistor 1032 4 is connected to the 100 output of vernier clock 1026. The drain electrode of transistor 1032-6 is connected to the 011 output of vernier clock 1026. The drain electrode of transistor 1032-7 is connected to the 110 output of vernier clock 1026 and the drain electrode of transistor 1032-8 is connected to the 111 output of vernier clock 1026.

The source electrodes of transistors 1033-10, 1033-11 and 1033-12 are connected to a negative voltage −VDD. The gate electrodes of transistors 1033-10, 1033-11 and 1033-12 are coupled to the A01, A11 and A21 outputs, respectively, of level shifter 1090. The source electrodes of transistors 1033-15 and 1033-16 are connected to the ground potential source. The drain electrode of transistor 1033-13 is connected to the positive voltage source +VCC and the gate electrode of transistor 1033-13 is coupled to the pulse source PRE1. The source electrode of transistor 1033-13 and the drain electrodes of transistors 1033-10, 1033-11, 1033-12 and 1033-16 are connected in common and to a node 1040-1 and are coupled to the gate electrode of transistor 1033-1 through the capacitor 1033-14. The gate electrode of transistor 1033-1 is connected to the drain electrode of transistor 1033-15 and the gate electrodes of transistors 1033-15 and 1033-16 are coupled to the pulse source PRE0. The source electrodes of transistors 1033-20, 1033-21 and 1033-22 are connected to a negative voltage −VDD. The source electrodes of transistors 1033-25 and 1033-26 are connected to the ground potential source. The gate electrodes of transistors 1033-20, 1033-21 and 1033-22 are coupled to the A01', A11 and A21 outputs, respectively, of level shifter 1090. The drain electrode of transistor 1033-23 is connected to the positive voltage source +VCC and the gate electrode of transistor 1033-23 is coupled to the pulse source PRE1. The source electrode of transistor 1033-23 and the drain electrodes of transistors 1033-20, 1033-21, 1033-22 and 1033-26 are connected in common and to a node 1040-2 and are coupled to the gate electrode of transistor 1033-1 through capacitor 1033-24. The gate electrode of transistor 1033-2 is connected to the drain electrode of transistor 1033-25 and the gate electrodes of transistors 1033-25 and 1033-26 are coupled to the pulse source PRE0.

The source electrodes of transistors 1033-30, 1033-31 and 1033-32 are connected to a negative voltage −VDD. The gate electrodes of transistors 1033-30, 1033-31 and 1033-32 are coupled to the A01, A11' and A21 outputs, respectively, of level shifter 1090. The source electrodes of transistors 1033-35 and 1033-36 are connected to the ground potential source. The drain electrode of transistor 1033-33 is connected to the positive voltage source +VCC and the gate electrode of transistor 1033-33 is coupled to the pulse source PRE1. The source electrode of transistor 1033-33 and the drain electrodes of transistors 1033-30, 1033-31, 1033-32 and 1033-36 are connected in common and to a node 1040-3 and are coupled to the gate electrode of transistor 1033-3 through capacitor 1033-34. The gate electrode of transistor 1033-3 is connected to the drain electrode of transistor 1033-35 and the gate electrodes of transistors 1033-35 and 1033-36 are coupled to the pulse source PRE0. The source electrodes of transistors 1033-40, 1033-41 and 1033-42 are connected to a negative voltage −VDD. The gate electrodes of transistors 1033-40, 1033-41 and 1033-42 are coupled to the A01', A11' and A21 outputs, respectively, of level shifter 1090. The source electrodes of transistors 1033-45 and 1033-46 are connected to the ground potential source. The drain electrode of transistor 1033-43 is connected to the positive voltage source +VCC and the gate electrode of transistor 1033-43 is coupled to the pulse source PRE1. The source electrode of transistor 1033-43 and the drain electrodes of transistors 1033-40, 1033-41, 1033-42 and 1033-46 are connected in common to a terminal 1040-4 and are coupled to the gate electrode of transistor 1033-4 through capacitor 1033-44. The gate electrode of transistor 1033-4 is connected to the drain electrode of transistor 1033-45 and the gate electrodes of transistors 1033-45 and 1033-46 are coupled to the pulse source PRE0.

The source electrodes of transistors 1033-50, 1033-51 and 1033-52 are connected to a negative voltage −VDD. The gate electrodes of transistors 1033-50, 1033-51 and 1033-52 are coupled to the A01, A11 and A21' outputs, respectively, of level shifter 1090. The source electrodes of transistors 1033-55 and 1033-56 are connected to the ground potential source. The drain electrode of transistor 1033-53 is connected to the positive voltage source +VCC and the gate electrode of transistor 1033-53 is coupled to the pulse source PRE1. The source electrode of transistor 1033-53 and the drain electrodes of transistors 1033-50, 1033-51, 1033-52 and 1033-56 are connected in common to a terminal 1040-5 and are coupled to the gate electrode of transistor 1033-5 through capacitor 1033-54. The gate electrode of transistor 1033-5 is connected to the drain electrode of transistor 1033-55 and the gate electrodes of transistors 1033-55 and 1033-56 are coupled to the pulse source PRE0. The source electrodes of transistors 1033-60, 1033-61 and 1033-62 are connected to a negative voltage −VDD. The gate electrodes of transistors 1033-60, 1033-61 and 1033-62 are coupled to the A01', A11 and A21' outputs, respectively, of level shifter 1090. The source electrodes of transistors 1033-65 and 1033-66 are connected to the ground potential source. The drain electrode of transistor 1033-63 is connected to the positive voltage source +VCC and the gate electrode of transistor 1033-63 is coupled to the pulse source PRE1. The source electrode of transistor 1033-63 and the drain electodes of transistors 1033-60, 1033-61, 1033-62 and 1033-66 are connected in common to a terminal 1040-6 and are coupled to the gate electrode of transistor 1033-6 through capacitor 1033-64. The gate electrode of transistor 1033-6 is connected to the drain electrode of transistor 1033-65 and the gate electrodes of transistors 1033-65 and 1033-66 are coupled to the pulse source PRE0.

The source electrodes of transistors 1033-70, 1033-71 and 1033-72 are connected to a negative voltage −VDD. The gate electrodes of transistors 1033-70, 1033-71 and 1033-72 are coupled to the A01, A11' and A21' outputs, respectively, of level shifter 1090. The source electrodes of transistors 1033-75 and 1033-76 are connected to the ground potential source. The drain electrode of transistor 1033-73 is connected to the positive voltage source +VCC and the gate electrode of transistor 1033-73 is coupled to the pulse source PRE1. The source electrode of transistor 1033-73 and the drain electrodes of transistors 1033-70, 1033-71, 1033-72 and 1033-76 are connected in common to a terminal 1040-7 and are coupled to the gate electrode of transistor 1033-7 through capacitor 1033-74. The gate electrode of transistor 1033-7 is connected to the drain electrode of transistor 1033-75 and the gate electrodes of transistors 1033-75 and 1033-76 are coupled to the pulse source PRE0. The source electrodes of transistors 1033-80, 1033-81 and 1033-82 are connected to a negative voltage −VDD. The gate electrodes of transistors 1033-80, 1033-81 and 1033-82 are coupled to the A01', A11' and A21' outputs, respectively, of level shifter 1090. The source electrodes of transistors 1033-85 and 1033-86 are connected to the ground potential source. The drain electrode of transistor 1033-83 is connected to the positive voltage source +VCC and the gate electrode of transistor 1033-83 is coupled to the pulse source PRE1. The source electrode of transistor 1033-83 and the drain electrodes of transistors 1033-80, 1033-81, 1033-82 and 1033-86 are connected in common to a terminal 1040-8 which is coupled to the gate electrode of transistor 1033-8 through capacitor 1033-84. The gate electrode of transistor 1033-8 is connected to the drain electrode of transistor 1033-85 and the gate electrodes of transistors 1033-85 and 1033-86 are coupled to the pulse source PRE0.

The operation of the vernier timing selection circuit 1030 of FIG. 10 is illustrated by describing the selection of the one of the vernier timing signals. Transistor 1033-1, for example, completes the path from column control line 285 to terminal 281 at the first vernier timing signal in response to the "0" A01, A11 and A21 outputs, respectively, of level shifter 1090 and the 000 output of vernier clock 1026. The gate electrode of transistor 1033-1 is controlled by the path selection signal applied from terminal 1040-1 through capacitor 1033-14 and the 000 output of vernier clock 1026 applied through capacitor 1030-1. The path selection signal at terminal 1040-1 is obtained from the NAND gate formed by transistors 1033-10, 1033-11 and 1033-12. Since the logical levels of the timing selection circuit of FIG. 10 are +VCC and −VDD, the A01, A11, and A21 as well as the A01', A11', and A21' outputs of level shifter 1090 operate between a +VCC level ("1") and a −VDD level ("0"). Level shifter 1090 is adapted to produce signals A01, A11, A21, A01', A11', and A21' in response the A0, A1, A2, A0', A1'. and A2' outputs of latch 222 in FIG. 2.

Figure 11:
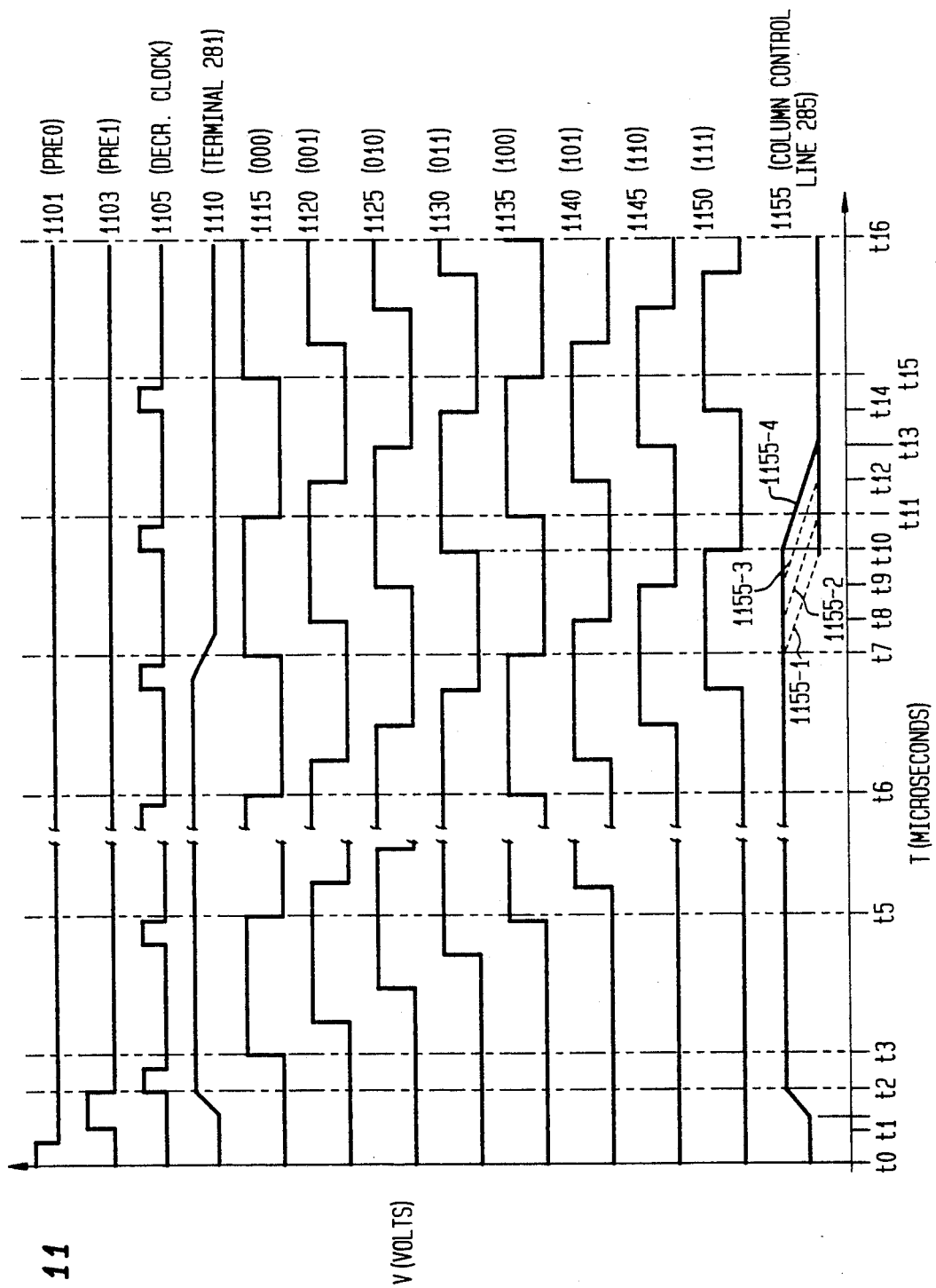
FIG. 11 is a timing diagram illustrating the operation of the vernier timing selection embodiment of FIG. 10.

FIG. 11 shows waveforms that illustrate the operation of the vernier timing selection circuit 1030 of FIG. 10. In FIG. 11, the waveforms are shown with voltage V (volts) on the y axis and time (microseconds) on the x axis. To make the operation clearer, each of the waveforms has essentially the same amplitude and the same "1" and "0" levels. Waveforms 1101 and 1103 show the PRE0 and PRE1 precharge pulses employed to place the circuit 1030 of FIG. 10 in its initial state at the beginning of each selected scan line. Waveform 1110 shows the voltage appearing on terminal 281. Waveforms 1115 through 1150 show the 000 through 111 outputs of vernier clock 1026 and waveform 1155 illustrates the voltage on the column control line 285 in FIG. 10.

At the beginning of each line scan, a "1" signal PRE0 is applied to the gate electrodes of transistors 1032-1 through 1032-8, 1033-15, 1033-25, 1033-35, 1033-45, 1033-55, 1033-65, 1033-75, 1033-85, 1033-16, 1033-26, 1033-36, 1033-46, 1033-56, 1033-66, 1033-76 and 1033-86. These transistors are enabled by pulse PRE0 to discharge capacitors 1030-1 through 1030-8 and capacitors 1033-14 through 1033-84 by coupling both ends of these capacitors to ground potential. With respect to the operation of transistor 1033-1, both ends of capacitor 1030-1 are coupled to ground potential through transistors 1032-1 and 1033-15 and both ends of capacitor 1033-14 are coupled to ground through transistors 1033-15 and 1033-16. In this way, capacitors 1030-1 and 1033-14 are initially discharged to ground prior to each scan line operation.

The source electrodes of transistors 1033-10, 1033-11 and 1033-12 are connected to a negative voltage source −VDD, e.g. −20 volts and the drain electrode of transistor 1033-13 is connected to the positive voltage source +VCC, e.g. +20 volts. After capacitor 1033-14 has been discharged in response to pulse PRE0 (waveform 1101) between times t0 and t1, transistor 1033-13 is enabled by "1" pulse signal PRE1 (waveform 1103) applied to its gate electrode and terminal 1040-1 at the commonly connected drain electrodes of transistors 1033-10, 1033-11 and 1033-12 is charged to +VCC. If any of the A01, A11 or A21 output signals from level shifter 1090 is a "1", terminal 1040-1 at the commonly connected drain electrodes of transistors 1033-10, 1033-11 and 1033-12 is discharged to −VDD at time t2. When the A01, A11 and A21 outputs, respectively, of level shifter 1090 are all "0"s, terminal 1040-1 remains at +VCC. Otherwise, the end of capacitor 1033-14 connected to terminal 1040-1 is at the voltage −VDD.

During each line scan shown between times t0 and t16 in FIG. 11, the 000 through 111 outputs of vernier clock 222 provide the sequence of vernier timing pulses as shown in waveforms 115 through 1150 of FIG. 11. The outputs of vernier clock 1026 are at zero volts during the PRE0 pulse of waveform 1101 between times t0 and t1. During the 000 timing pulse, e.g. between times t3 and t5 and between t7 and t11, the 000 output shown in waveform 1115 is at +VCC voltage level. Between 000 timing pulses, e.g. t11 and t15, the 000 output is at the −VDD voltage level. In order to enable transistor 1033-1, terminal 1040-1 and the 000 output of vernier clock 1026 must both be at +VCC concurrently. If both terminal 1040-1 and the 000 output of vernier clock 1026 are at −VDD voltage level or either terminal 1040-1 or the 000 output is at the −VDD level, the voltage at the gate electrode of transistor 1033-1 remains below the threshold voltage required to enable the transistor. When both terminal 1040-1 and the 000 vernier clock output are at the +VCC level, transistor 1033-1 is enabled and a path is established from column control line 285 and terminal 281.

Each of the NAND gates associated with transistors 1033-1 through 1033-8 receives a different combination of A01, A11 and A21 bits from level shifter 1090. Since a different cimbination of A01, A11 and A21 bits is coupled to each path selector, only one of transistors 1033-1 through 1033-8 can receive a path selection enabling input in response to the outputs of latch 222 of FIG. 2. Transistor 1033-2 receives a path enabling input only when the A01', A11 and A21 outputs of level shifter 1090 are "0"s. Transistor 1033-3 receives an enabling input from terminal 1040-3 only in response to "0" A01, A11' and A21 outputs of level shifter 1090. Transistor 1033-4 receives an enabling input from terminal 1040-4 only when the A01', A11' and A21 outputs of level shifter 1090 of FIG. 2 are "0"s. Transistor 1033-5 receives an enabling input from terminal 1040-5 only in response to the "0" A01, A11 and A21' outputs of level shifter 1090. Transistor 1033-6 receives an enabling input from terminal 1040-6 only when the A01', A11 and A21' outputs of level shifter 1090 are "0"s. Transistor 1033-7 receives an enabling input from terminal 1040-7 only in response to "0" A01, A11' and A21' outputs of level shifter 1090 and transistor 1033-8 receives an enabling input from terminal 1040-8 only in response to "0" A01', A11' and A21' outputs of level shifter 1090.

In the event that the A01' and A11' bits from level shifter 1090 are "0"s and the A21 bit therefrom is a "0", the commonly connected drain electrodes of transistors 1033-40, 1033-41 and 1033-42 are at the +VCC voltage level. When the 011 output of vernier clock 1026 changes to +VCC, e.g. at times t4, t10 and t16 in waveform 1130, transistor 1033-4 is enabled so that the path from column control line 285 to terminal 281 is enabled through transistor 1033-4. Applying the A21 and A21' bit outputs of level shifter 1090 to transistors 1033-13 through 1033-83 in the NAND gates which drives transistors 1033-1 through 1033-8 prevents the enabling of both a path selected from the group including transistors 1033-1 through 1033-4 and a path selected from the group including transistors 1033-5 through 1033-8 in the same interval between decrement clock pulses.

Prior to the start of the ramp signal from analog signal generator 240 in FIG. 2, capacitors 1030-1 through 1030-8 and capacitors 1033-14 through 1033-84 are discharged in response to the PRE0 pulse. Precharge signal PRE charges nodes 1040-1 through 1040-8 to the +VCC voltage level Where the A0, A1 and A2 bit signals from latch 222 in FIG. 2 form a 011 code, the gate electrodes of transistors 1033-40, 1033-41 and 1033-42 in FIG. 10 receive "0" signals and terminal 1040-4 remains at the +VCC voltage level set by signal PRE. The corresponding nodes 1040-1 through 1040-3 and 1040-5 through 1040-8 revert to the −VDD voltage level in response to the A0, A1 and A2 bit combinations applied to the NAND gate transistors associated therewith.

When counter 220 of FIG. 2 is decremented to zero, terminal 281 is discharged to ground potential through transistors 251 and 258 as previously described with respect to FIG. 2. The discharge of terminal 281 is illustrated in waveform 1110 of FIG. 11 at time t7. Transistor 1033-4 which has its drain electrode connected to column control line 285 is enabled by the 011 vernier timing pulse (waveform 1130) at time t10 in FIG. 11. The transition portion 1155-4 of waveform 1155 shows the turn on of transistor 1033-4 starting at time t10 and ending at time t13. As a result, column control line 285 is discharged to ground potential through transistor 1033-4 in FIG. 10 and transistors 251 and 258 in FIG. 2. Waveform 1155 also indicates the transition portions of waveform 1155 for A2=0 and other values of the A0 and A1 as dashed lines 1155-1, 1155-2, 1155-3, Since the A2 output of latch 222 of FIG. 2 is a "0", only the paths through vernier timing circuit 1030 between column control line 285 and terminal 281 are effective to discharge column control line 285. In accordance with the present invention, each interval between decrement clock pulses is divided into vernier timing intervals so that accurate timing is obtained with greatly reduced counting rates.

It is to be understood that the specific embodiments described herein are intended merely to be illustrative of the spirit and scope of the invention. Modifications can readily be made by those skilled in the art consistent with the principles of this invention. The embodiments described herein may use bulk or other types of transistors rather than thin film transistors. Further, the embodiments may be used to provide timing control in apparatus other than display driver circuits.

What is claimed is:

1. A timing circuit for controlling a signal transfer device comprising:
    means for receiving an n bit information signal having an m bit most significant portion and an n−m bit least significant portion;
    means for generating a time interval initiating signal;
    means coupled to the time interval initiating signal generating means responsive to the time interval initiating signal for enabling the signal transfer device; and
    means coupled to the information signal receiving means responsive to the n bit information signal for disabling the signal transfer device at a time corresponding to the value of the n bit information signal comprising:
    means for generating first timing signals occurring at predetermined time intervals;
    means responsive to the first timing signals for generating a sequence of second timing signals occurring at sub-intervals of the predetermined time intervals;
    counting means for generating a control signal on reaching a predetermined value;
    means coupled to the information signal receiving means responsive to the m most significant bits of the n bit information signal for setting the counting means to a value corresponding to the m most significant bits of the n bit information signal;
    means responsive to the first timing signals for decrementing the counting means at the predetermined time intervals to the predetermined value;

means responsive to at least the n−m least significant bits of the n bit information signal for selecting one of the second timing signals; and means jointly responsive to the selected second timing signal and the control signal for disabling the signal transfer device at a time corresponding to the occurrence of the selected second timing signal immediately succeeding the counter reaching the predetermined value.

2. The circuit of claim 1 wherein:

the signal transfer device comprises a charge controlled device having a control electrode;

the means for enabling the signal transfer device comprises means responsive to the time interval initiating signal for charging the control electrode of the charge controlled device to a first state; and the means for disabling the signal transfer device at a time corresponding to the occurrence of the selected second timing signal immediately succeeding the counter reaching the predetermined value comprises means responsive to the selected second timing signal and the control signal for discharging the control electrode of the charge controlled device to a second state.

3. The circuit of claim 2 wherein the means for discharging the control electrode of the charge controlled device to the second state comprises:

a first discharge path;

a second discharge path;

the first discharge path and the second discharge path being serially connected to the control electrode of the charge controlled device;

means responsive to the selected second timing signal for closing the first discharge path;

means responsive to the control signal for closing the second discharge path; and the control electrode of the charge controlled device being discharged through the serially connected first and second discharge paths at the time corresponding to the occurrence of the selected second timing signal immediately succeeding the counter reaching the predetermined value.

4. The circuit of claim 3 wherein:

the at least n−m least significant bits includes the n−m+1 th bit of the n bit information signal; and the first discharge path comprises a plurality of first switching means each coupled between the control electrode of the charged controlled device and the second discharge path and means responsive to the n−m+1 least significant information signal bits for selecting one of the first switching means.

5. The circuit of claim 4 wherein the second discharge path comprises:

a plurality of second switching means coupled to the first discharge path; and means responsive to the n−m+1 th least significant bit of the information signal for selecting one of the second switching means.

6. The circuit of claim 5 wherein:

the plurality of second switching means comprises a pair of second switching elements;

the plurality of first switching means comprises a first group of $2^{n-m+1}/2$ of first switching elements and a second group of $2^{n-m+1}/2$ first switching elements;

one of the second switching elements being serially connected with the first group of $2^{n-m+1}/2$ first switching elements to discharge the control electrode of the charge controlled device in response to selected second timing signal and the n−m+1 th information signal bit being a zero bit; and the other of the second switching elements being serially connected with the second group of first switching elements to discharge the control electrode of the charge controlled device in response to the selected second timing signal and the n−m+1 th information signal being a one bit.

7. The circuit of claim 6 wherein:

each second switching element comprises first and second switching devices connected in series, each having a control electrode;

means for applying the control signal to the control electrode of the first switching device; and means for applying the n−m+1 th information signal bit to the control electrode of the second switching device.

8. The circuit of claim 7 wherein each first switching device and each second switching device is an n-channel field effect transistor.

9. The circuit of claim 8 wherein each n-channel field effect transistor is a thin film transistor.

10. The circuit of claim 7 wherein each first switching element comprises:

a third switching device having a pair of output electrodes and a control electrode, one of the output electrodes being coupled to the second discharge path;

gating means coupled to the control electrode of the third switching device responsive to a predetermined state of the n−m+1 least significant bits of the n bit information signal for enabling the third switching device; and means coupled to the other output electrode of the third switching device responsive to the selected second timing signal for coupling the third switching device to the control electrode of the charge controlled device on the occurrence of the selected second timing signal.

11. The circuit of claim 10 wherein each third switching device is an n-channel field effect transistor.

12. The circuit of claim 11 wherein the n-channel field effect transistor is a thin film transistor.

13. The circuit of claim 7 wherein each first switching element comprises:

a fourth switching device having a pair of output electrodes coupled between the control electrode of the charge controlled device and the second discharge path and a control electrode; and gating means coupled to the control electrode of the fourth switching device jointly responsive to a predetermined state of the n−m+1 least significant bits of the n bit information signal and the selected second timing signal for enabling the fourth switching device on the occurrence of the selected second timing signal.

14. The circuit of claim 13 wherein each fourth switching device is an n-channel field effect transistor.

15. The circuit of claim 14 wherein the n-channel field effect transistor is a thin film transistor.

16. The circuit of claim 7 wherein each first switching element comprises:

a fifth switching device having a pair of output electrodes with a prescribed impedance therebetween coupled between the control electrode of the charge controlled device and the second discharge path and a control electrode;

gating means coupled to the control electrode of the fifth switching device responsive to a predetermined state of the n−m+1 least significant bits of the n bit information signal for enabling the fifth switching device to connect the charge controlled device to the second discharge path through the prescribed impedance path whereby the time to discharge the control electrode of the charge controlled is determined.

17. The circuit of claim 16 wherein each fifth switching device is an n-channel field effect transistor.

18. The circuit of claim 17 wherein the n-channel field effect transistor is a thin film transistor.

19. In a video display pixel drive, a timing circuit for controlling a signal transfer device in response to an n bit gray scale brightness signal having an m bit most significant portion and an n−m bit least significant portion comprising:

means for generating a time interval initiating signal;
means responsive to the time interval initiating signal for enabling the signal transfer device; and
means responsive to the n bit digital gray scale brightness signal for disabling the signal transfer device at an instant corresponding to the value of the n bit digital gray scale signal comprising;
means for generating clock signals at predetermined time intervals;
means responsive to the clock signals for generating a set of vernier timing signals at prescribed instants;
an m<n bit digital counter for generating a control signal on reaching a predetermined value;
means responsive to the n bit gray scale brightness signal for setting the m bit digital counter to the m most significant bits of the n bit digital gray scale signal;
latch means for storing at least the n−m least significant bits of the n bit digital gray scale signal;
means responsive to the clock signals for decrementing the m bit digital counting means from the value corresponding to the m most significant bits to the predetermined value;
means responsive to the at least n−m least significant bits stored in the latch means for selecting one of the vernier timing signals; and
means jointly responsive to the selected vernier timing signal and the control signal for disabling the signal transfer device at a time corresponding to the selected vernier timing signal immediately succeeding the decrementing of the digital counter to the predetermined value.

20. The timing circuit of claim 19 wherein:
the signal transfer device comprises a transistor having a gate electrode;
the means for enabling the signal transfer device comprises means responsive to the time interval initiating signal for charging the gate electrode to enable the signal transfer transistor; and
the means for disabling the signal transfer device at a time corresponding to the occurrence of the selected vernier timing signal immediately succeeding the digital counter reaching the predetermined value comprises means responsive to the selected vernier timing signal and the control signal for discharging the gate electrode of the signal transfer transistor to disable the signal transfer transistor.

21. The circuit of claim 20 wherein the means for discharging the gate electrode of the signal transfer transistor comprises:

a first discharge path;
a second discharge path;
the first discharge path and the second discharge path being connected in series to the gate electrode of the transistor; means responsive to the control signal for closing the first discharge path upon the digital counter reaching its predetermined value; and
means responsive to the selected vernier timing signal for closing the second discharge path on the occurrence of the selected vernier timing signal; and
the gate electrode of the signal transfer transistor being discharged through the serially connected first and second discharge paths responsive to the selected vernier timing signal and the control signal at the time corresponding to the occurrence of the selected vernier timing signal immediately succeeding the digital counter reaching the predetermined value.

22. The circuit of claim 21 wherein:
the at least n−m least significant bits includes the n−m+1 bit of the n bit gray scale brightness signal; and
the first discharge path comprises
a plurality of parallel connected first switching paths; and means responsive to the n−m+1th gray scale brightness signal bit for selecting one of the first switching paths.

23. The circuit of claim 22 wherein the second discharge path comprises a plurality of parallel connected second switching paths and means responsive to the at least n−m+1 least significant bits of the gray scale brightness signal for selecting one of the second switching paths.

24. The circuit of claim 23 wherein:
the plurality of first switching paths comprises a pair of first switching elements;
the plurality of second switching paths comprises a first group of $2^{n-m+1}/2$ second switching elements and a second group of $2^{n-m+1}/2$ second switching elements;
one of the pair of first switching elements being serially coupled with the parallel connected first group of $2^{n-m+1}/2$ second switching elements to discharge the gate electrode of the signal transfer transistor in response to the n−m+1th gray scale brightness signal bit being one type bit;
the other of the pair of first switching elements being serially connected with the second group of $2^{n-m+1}/2$ second switching elements to discharge the gate electrode of the signal transfer transistor in response to the n−m+1th gray scale brightness signal bit being the other type bit.

25. The circuit of claim 24 wherein:
each first switching element comprises first and second switching transistors connected in series each having a gate electrode;
means for applying the control signal to the gate electrode of the first switching transistor; and
means for applying a signal corresponding to the n−m+1th gray scale brightness signal bit to the gate electrode of the second switching transistor.

26. The circuit of claim 25 wherein each first switching transistor and each second switching transistor is an n-channel field effect transistor.

27. The circuit of claim 26 wherein the n-channel field effect transistor is a deposited thin film transistor.

28. The circuit of claim 24 wherein each second switching element comprises:

a third switching transistor having first, second and gate electrodes;

the second electrode of the third switching transistor being coupled to the first discharge path;

gating means responsive to a predetermined state of the n−m+1 least significant bits of the n bit information signal for enabling the third switching transistor; and means responsive to the selected vernier timing signal for coupling the first electrode of the third switching transistor to the gate electrode of the signal transfer transistor.

29. The circuit of claim 28 wherein each third switching transistor is an n-channel field effect transistor.

30. The circuit of claim 29 wherein the n-channel field effect transistor is a deposited thin film transistor.

31. The circuit of claim 24 wherein each second switching element comprising:

a fourth switching transistor having first, second and gate electrodes;

the first and second electrodes of the fourth switching transistor being coupled between the gate electrode of the signal transfer transistor and the first discharge path; and gating means connected to the gate electrode of the fourth switching transistor jointly responsive to a predetermined state of the n−m+1 least significant bits of the n bit information signal and the selected vernier timing signal for enabling the fourth switching transistor to connect the signal transfer transistor to the first discharge path.

32. The circuit of claim 31 wherein each fourth switching transistor is an n-channel field effect transistor.

33. The circuit of claim 32 wherein the n-channel field effect transistor is a deposited thin film transistor.

34. The circuit of claim 24 wherein each second switching element comprises:

a fifth switching transistor having first, second and gate electrode and a prescribed impedance path between the first and second electrodes;

the first electrode of the fifth switching transistor being coupled to the gate electrode of the signal transfer transistor;

the second electrode of the fifth switching transistor being coupled to the first discharge path; and gating means connected to the gate electrode of the switching transistor responsive to a predetermined state of the n−m+1 least significant bits of the n bit information signal for enabling the fifth switching transistor to couple the signal transfer switching transistor to the first discharge path through the prescribed impedance path.

35. The circuit of claim 34 wherein each fifth switching transistor is an n-channel field effect transistor.

36. The circuit of claim 35 wherein the n-channel field effect transistor is a deposited thin film transistor.

37. A circuit for selecting a timing signal comprising:

means for producing an n bit information signal having an m bit most significant portion and an n−m bit least significant portion;

means for generating a time interval initiating signal;

means for generating first timing signals occurring at predetermined time intervals;

means responsive to the first timing signals for generating a sequence of second timing signals occurring at sub-intervals of the predetermined time intervals;

means for generating a control signal on reaching a predetermined value;

means coupled to the information signal receiving means responsive to the m most significant bits of the n bit information signal for setting the counting means to a value corresponding to the m most significant bits of the n bit information signal;

means responsive to the first timing signals for decrementing the counting means at the predetermined time intervals to the predetermined value;

means responsive to at least the n−m least significant bits of the n bit information signal for selecting one of the second timing signals.

* * * * *